(12) United States Patent
Vodrahalli et al.

(10) Patent No.: US 11,011,500 B2
(45) Date of Patent: May 18, 2021

(54) MEMORY SCALING SEMICONDUCTOR DEVICE

(71) Applicant: SANDISK TECHNOLOGIES LLC, Addison, TX (US)

(72) Inventors: Nagesh Vodrahalli, Los Altos, CA (US); Shrikar Bhagath, San Jose, CA (US); Chih Yang Li, Menlo Park, CA (US); Srinivasan Sivaram, Los Gatos, CA (US); Rama Shukla, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 16/816,495

(22) Filed: Mar. 12, 2020

(65) Prior Publication Data

US 2021/0104495 A1    Apr. 8, 2021

Related U.S. Application Data

(63) Continuation of application No. 16/594,716, filed on Oct. 7, 2019.

(51) Int. Cl.
*H01L 25/065*    (2006.01)
*H01L 23/00*    (2006.01)
*H01L 25/00*    (2006.01)

(52) U.S. Cl.
CPC ........ *H01L 25/0657* (2013.01); *H01L 23/562* (2013.01); *H01L 24/08* (2013.01); *H01L 24/48* (2013.01); *H01L 25/50* (2013.01); *H01L 2224/08146* (2013.01); *H01L 2224/48147* (2013.01); *H01L 2225/06506* (2013.01); *H01L 2225/06524* (2013.01); *H01L 2225/06541* (2013.01); *H01L 2225/06562* (2013.01); *H01L 2225/06586* (2013.01); *H01L 2924/3511* (2013.01)

(58) Field of Classification Search
CPC ...................................................... H01L 25/50
See application file for complete search history.

(56) References Cited

U.S. PATENT DOCUMENTS

| 6,406,636 | B1 | 6/2002 | Vaganov |
| 6,950,758 | B2 | 9/2005 | Morford |
| 8,158,456 | B2 | 4/2012 | Chen et al. |
| 2015/0279431 | A1 | 10/2015 | Li et al. |

(Continued)

OTHER PUBLICATIONS

Preliminary Amendment filed Nov. 18, 2019 in U.S. Appl. No. 16/594,716.

(Continued)

*Primary Examiner* — William A Harriston
(74) *Attorney, Agent, or Firm* — Vierra Magen Marcus LLP

(57) ABSTRACT

A semiconductor device is disclosed including a memory module formed from a pair of semiconductor dies mounted face to face to each other at the wafer level. These die pairs are formed using wafer-to-wafer bonding technology, where the wafers may be bonded to each other when they are of full thickness. The semiconductor device may further include a CMOS logic circuit as part of the pair of semiconductor dies or in its own semiconductor die mounted to the pair of semiconductor dies.

20 Claims, 19 Drawing Sheets

(56) References Cited

U.S. PATENT DOCUMENTS

2016/0155724 A1    6/2016  Kim et al.
2019/0043836 A1*  2/2019  Fastow .............. H01L 25/0657

OTHER PUBLICATIONS

Supplemental Preliminary Amendment filed Apr. 2, 2020 in U.S. Appl. No. 16/594,716.
Restriction Requirement dated Aug. 19, 2020 in U.S. Appl. No. 16/594,716.
U.S. Appl. No. 16/594,716, filed Oct. 7, 2019.
U.S. Appl. No. 16/816,466, filed Mar. 12, 2020.
Office Action dated Feb. 4, 2021 in U.S. Appl. No. 16/816,466.
Response to Office Action filed Feb. 1, 2021 in U.S. Appl. No. 16/594,716.
Office Action dated Nov. 20, 2020 in U.S. Appl. No. 16/594,716.
Response to Restriction Requirement filed Oct. 19, 2020 in U.S. Appl. No. 16/594,716.

* cited by examiner

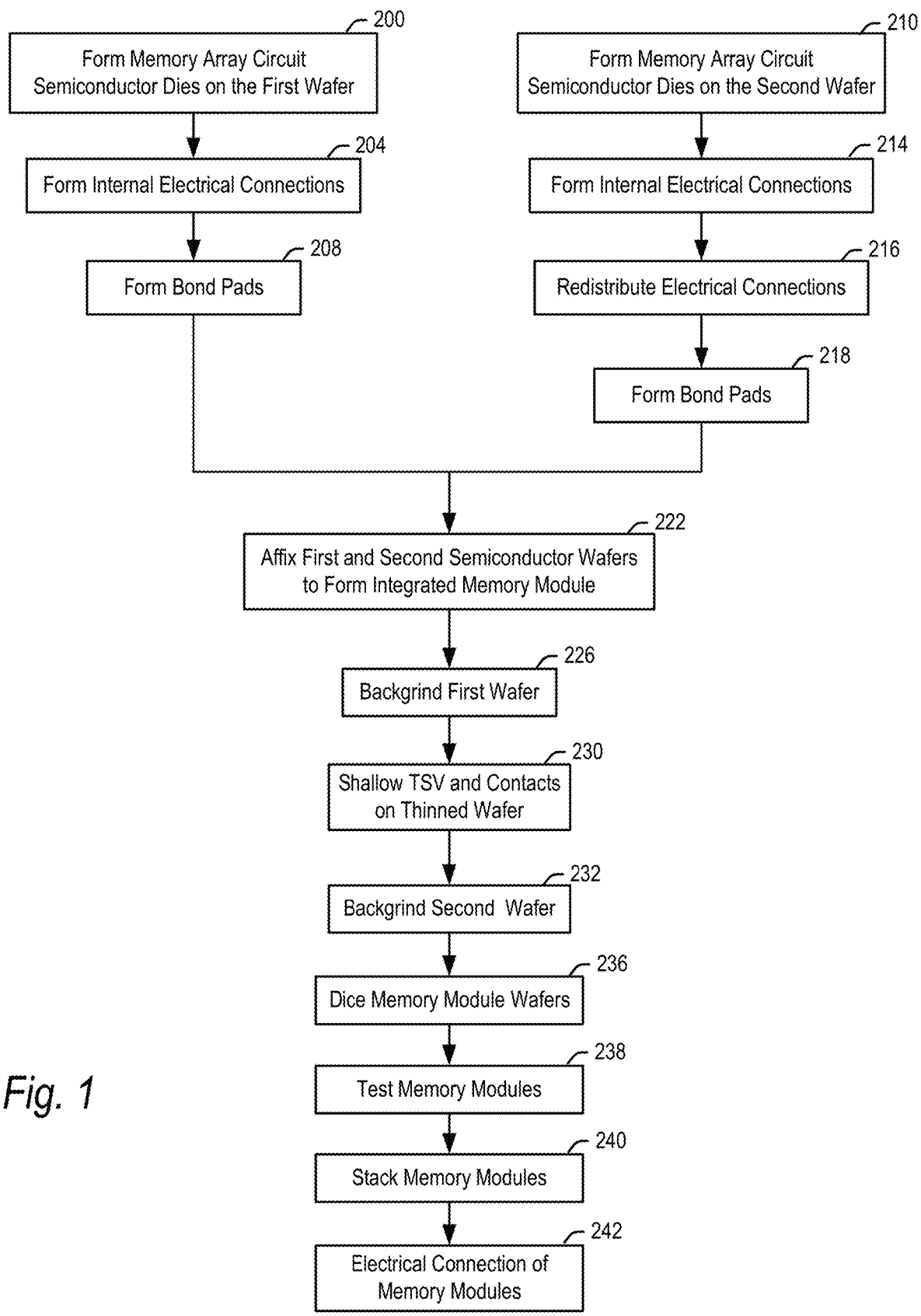

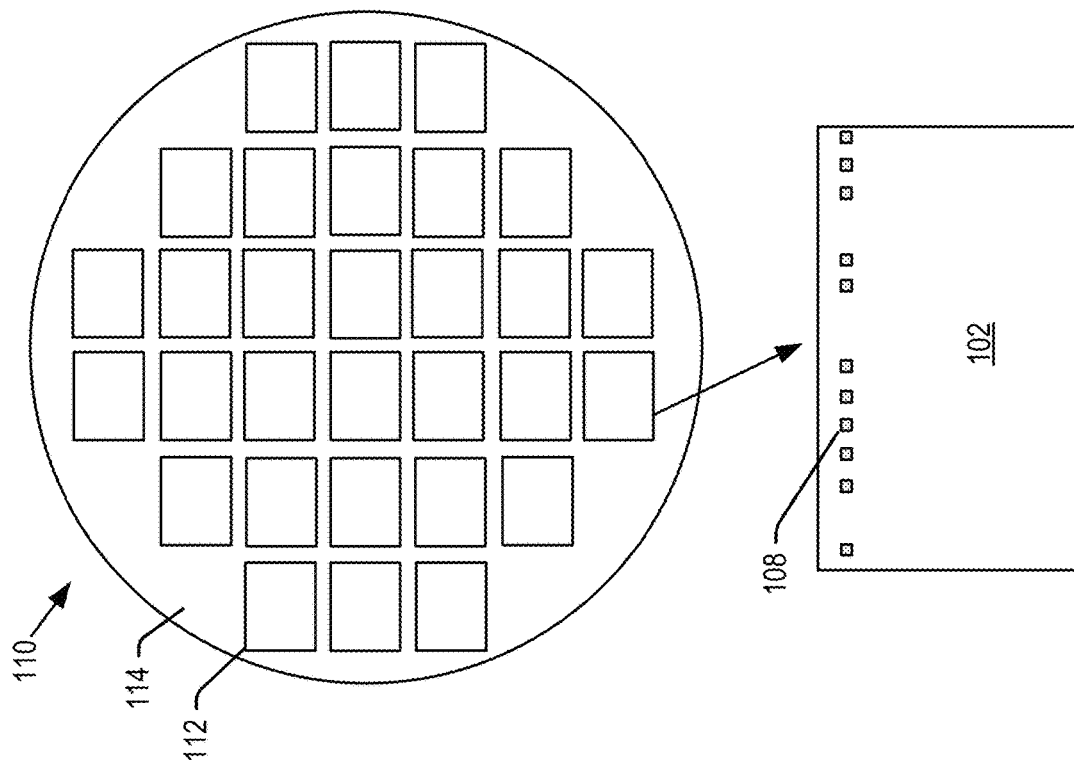
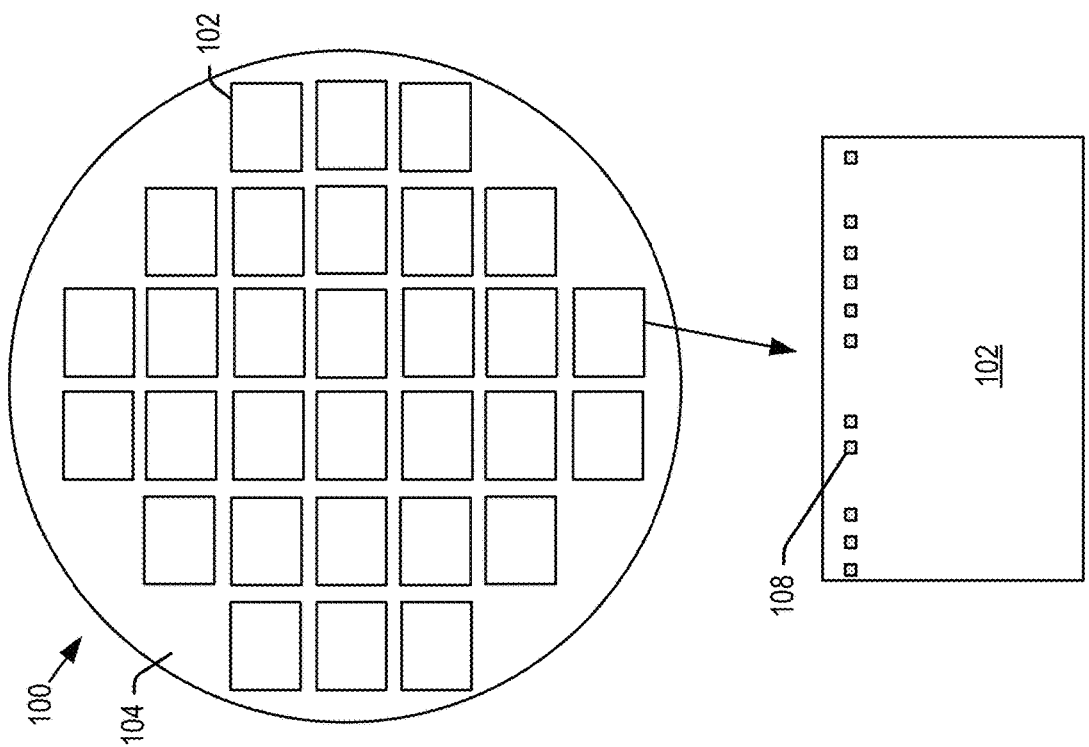

MEMORY SCALING SEMICONDUCTOR DEVICE

CLAIM OF PRIORITY

The present application is a continuation of U.S. patent application Ser. No. 16/594,716, entitled "MEMORY SCALING SEMICONDUCTOR DEVICE," filed Oct. 7, 2019, which application is incorporated by reference herein in its entirety.

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives (SSDs).

Recently, ultra high density memory devices have been proposed using a 3D stacked memory structure having strings of memory cells formed into layers. One such storage device is sometimes referred to as a Bit Cost Scalable (BiCS) architecture. BiCS and other NAND memory devices are fabricated in a wafer which includes the memory device layer formed in a substrate base, such as silicon. The wafer is diced into individual semiconductor dies, which are then stacked, electrically connected and encapsulated to form a competed semiconductor memory package.

Given the ever-present drive to provide greater storage capacity in a smaller form factor, semiconductor devices are made as thin as possible, currently about 36 microns (μm). Mechanical factors such as die warping, chipping and/or cracking during semiconductor package fabrication are proving a barrier to further reduction in thickness of semiconductor dies. For example, heating of the semiconductor dies during package fabrication causes the dies to warp given the different coefficients of thermal expansion between the memory device layers and silicon substrate. This warping becomes significant at thicknesses below 36 μm, to the point where the dies may crack when stacked and/or encapsulated. Moreover, when dies are thinned, for example to below 36 μm, die chipping or cracking when handled during fabrication also becomes a significant problem preventing further reductions in the thicknesses of semiconductor dies.

DESCRIPTION OF THE DRAWINGS

FIG. 1 is a flowchart for forming a semiconductor device according to embodiments of the present technology.

FIG. 2 is a top view of a first semiconductor wafer, and a first semiconductor die therefrom, according to embodiments of the present technology.

FIG. 3 is a top view of a second semiconductor wafer, and a second semiconductor die therefrom, according to embodiments of the present technology.

DETAILED DESCRIPTION

Figure 4:
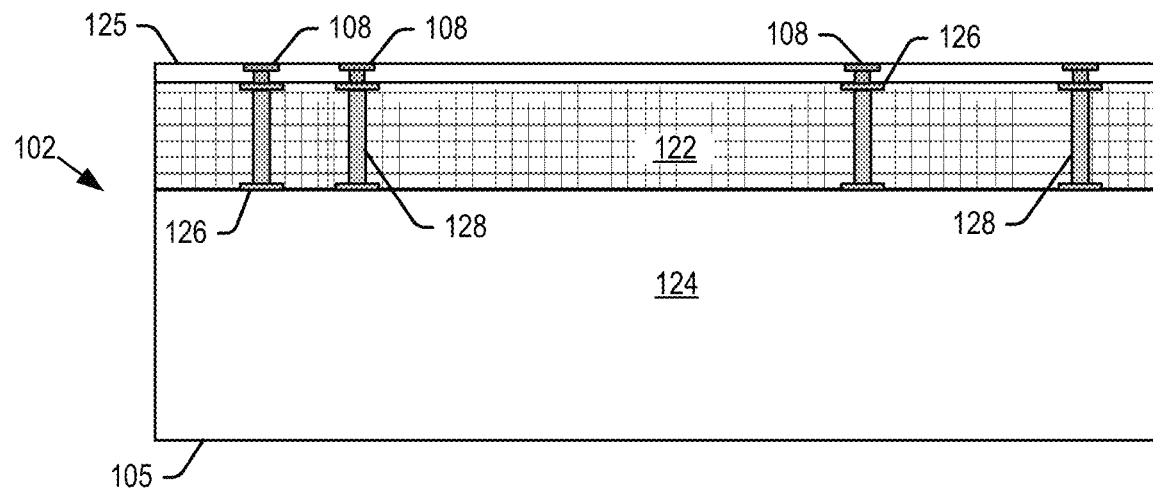
FIG. 4 is a cross-sectional edge view of a first semiconductor of the first wafer die according to embodiments of the present technology.

The present technology will now be described with reference to the figures, which in embodiments, relate to a semiconductor device including an integrated memory module. The integrated memory module may include a pair of semiconductor dies, having a device layer formed in a silicon substrate. The pair of dies may be affixed to each other face to face; that is, with their active surfaces facing each other. In such a configuration, the disparate coefficients of thermal expansion of the device layers and silicon substrate balance each other to prevent warping of the module. This ability to prevent warping in part enables a high memory density device where the thicknesses of the respective dies in the module may be thinner than was previously achievable. Additionally, the overall thickness of the module may be sufficient to avoid chipping or cracking during handling of the module during fabrication.

Economies of scale may be achieved by fabricating a number of memory modules simultaneously at the wafer level. In particular, a pair of wafers may be formed with aligned (mirror image) bond pads. Thereafter the wafers may be physically and electrically coupled to each other, for example in a Cu—Cu bonding process or a hybrid bonding process. The respective memory modules may then be diced and stacked into a completed semiconductor device.

In some embodiments, an integrated memory module may include logic circuits such as a CMOS logic circuit. In further embodiments, electronic components may be affixed by flip chip bonding to an upper surface of a memory module.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±2.5% of a given dimension. Depending on the parameter, the manufacturing tolerances may be greater than that in further embodiments, including for example ±5%, ±10% and ±25%

An embodiment of the present technology will now be explained with reference to the flowchart of FIG. 1, and the views of FIGS. 2-34. In step 200, a first semiconductor wafer 100 may be processed into a number of first semiconductor dies 102 as shown in FIG. 2. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The semiconductor wafer 100 may be cut from the ingot and polished on both the first major planar surface 104, and second major planar surface 105 (FIG. 4) opposite surface 104, to provide smooth surfaces. The first major surface 104 may undergo various processing steps to divide the wafer 100 into the respective first semiconductor dies 102, and to form integrated circuits of the respective first semiconductor dies 102 on and/or in the first major surface 104.

In particular, in step 200, the first semiconductor die 102 may be processed in embodiments to include integrated circuit memory cell array 122 formed in a dielectric substrate 124 as shown in the cross-sectional edge view of FIG. 4. FIG. 4 shows a single semiconductor die 102 from wafer 100. The substrate 124 may for example be or include silicon, such as silicon dioxide, but may be or include other materials in further embodiments. A passivation layer 125 may be formed on top of surface of the dies 102. The passivation layer 125 may for example be silicon dioxide, but may be formed of other materials in further embodiments. Such additional materials may include silicon nitride, silicon carbon nitride or others.

The memory cell array 122 may be configured to include multiple memory elements in which each element is individually accessible. By way of non-limiting example, memory cell array 122 may be a flash memory system in a NAND configuration (NAND memory) that contains memory elements connected in series. A NAND string is an example of a set of series-connected transistors comprising memory cells and select gate transistors.

The memory cell array 122 may be configured so that the array is composed of multiple strings of memory in which a string is composed of multiple memory elements sharing a single bit line and accessed as a group. Alternatively, memory elements of memory cell array 122 may be configured so that each element is individually accessible, e.g., a NOR memory array. NAND and NOR memory configurations are exemplary, and memory elements may be otherwise configured.

The memory cell array 122 can be two-dimensional (2D), or three-dimensional (3D) including so-called BiCS memory arrays. A 3D memory array is arranged so that memory elements occupy multiple planes or multiple memory device levels, thereby forming a structure in three dimensions (i.e., in the x, y and z directions, where the z direction is substantially perpendicular, and the x and y directions are substantially parallel, to the major planar surface 104 of the first semiconductor die 102). It is understood that the memory cell array 122 may have other configurations in further embodiments.

After or during formation of the memory cell array 122, internal electrical connections may be formed within the first semiconductor die 102 in step 204. The internal electrical connections may include multiple layers of metal interconnects 126 and vias 128 formed sequentially through layers of the substrate 124. As is known in the art, the metal interconnects 126, vias 128 and substrate 124 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 126 may be formed of a variety of electrically conductive metals including for example copper and copper alloys as is known in the art, and the vias 128 may be lined and/or filled with a variety of electrically conductive metals including for example tungsten, copper and copper alloys as is known in the art.

In step 208, bond pads 108 may be formed on the major planar surface 104 of the first semiconductor dies 102 as shown in FIGS. 2 and 4. The memory array circuits 122 may be electrically connected to the bond pads 108 by the metal interconnects 126 and vias 128. The number and position of metal interconnects 126, vias 128 and bond pads 108 shown in FIGS. 2 and 4 is by way of example only, and may vary in further embodiments. For example, each first die 102 may include more metal interconnects 126, vias 128 and bond pads 108 than are shown in further embodiments, and may include various other patterns of bond pads 108.

In embodiments, the bond pads 108 may be about 40 μm square and spaced from each other with a pitch of at least 41 μm and larger. For example, the pitch can be 45 μm to 50 μm or larger. It is understood that the size of bond pads 108 and the pitch between bond pads 108 may be other than that in further embodiments. FIG. 2 shows semiconductor dies 102 on wafer 100, and bond pads 108 in a line along one edge of the semiconductor dies 102. The pattern of bond pads 108 are shown for illustrative purposes, and may vary in further embodiments.

Before, after or in parallel with the formation of the first semiconductor dies on wafer 100, a second semiconductor wafer 110 may be processed into a number of second semiconductor dies 112 in step 210 as shown in FIG. 3. The semiconductor wafer 110 may start as an ingot of monocrystalline silicon grown according to either a CZ, FZ or other process. The second semiconductor wafer 110 may be cut and polished on both the first major surface 114, and second major surface 115 (FIG. 5) opposite surface 114, to provide smooth surfaces. The first major surface 114 may undergo various processing steps to divide the second wafer 110 into the respective second semiconductor dies 112, and to form integrated circuits of the respective second semiconductor dies 112 on and/or in the first major surface 114.

Figure 5:
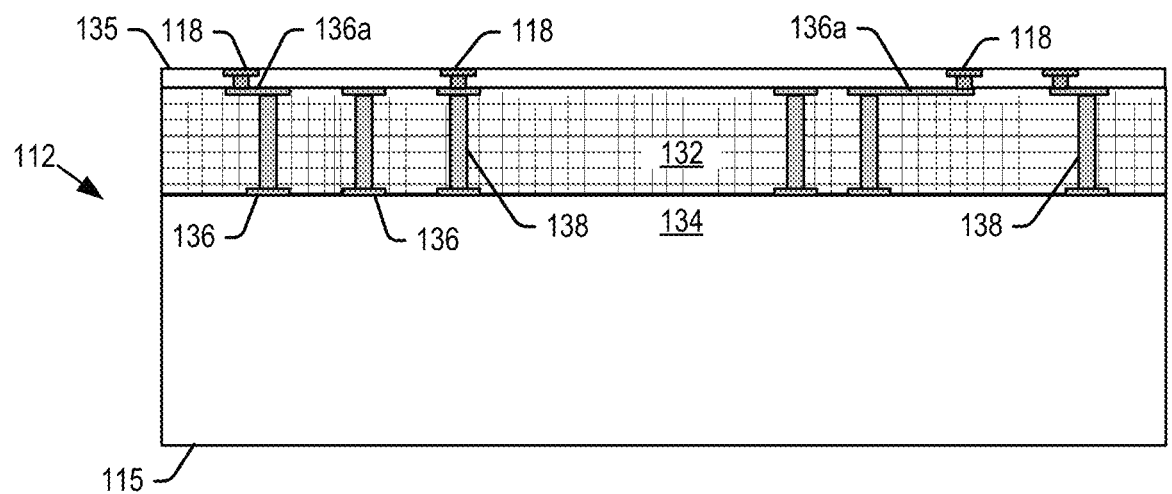
FIG. 5 is a cross-sectional edge view of a second semiconductor die of the second wafer according to embodiments of the present technology.

In one embodiment, the second semiconductor dies 112 may be processed to include integrated circuit memory cell array 132 formed in a dielectric substrate 134 as shown in the cross-sectional edge view of FIG. 5. FIG. 5 shows a single semiconductor die 112 from wafer 110. The substrate 134 may for example be or include silicon, such as silicon dioxide, but may be or include other materials in further embodiments. The memory cell array 132 may be formed as a 3D stacked memory structure having strings of memory cells formed into layers as described above with respect to memory cell array 122. However, it is understood that the second semiconductor dies 112 may be processed to include integrated circuits other than a 3D stacked memory structure. A passivation layer 135 may be formed on top of surface of the dies 112.

After formation of the memory cell array 132, internal electrical connections may be formed within the second semiconductor die 112 in step 214. The internal electrical connections may include multiple layers of metal interconnects 136 and vias 138 formed sequentially through layers of the substrate 134. As noted, the metal interconnects 136, vias 138 and dielectric film layers 134 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 136 may be formed of a variety of electrically conductive metals including for example copper and copper alloys as is known in the art, and the vias 138 may be lined and/or filled with a variety of electrically conductive metals including for example tungsten, copper and copper alloys as is known in the art.

In step 218, bond pads 118 may be formed in a passivation layer 135 on the major planar surface 114 of the second semiconductor dies 112 as shown for example in FIG. 5. The passivation layer 135 may for example be silicon dioxide, but may be formed of other materials in further embodiments. Such additional materials may include silicon nitride, silicon carbon nitride or others. The memory array circuits 132 may be electrically connected to the bond pads 118 by the metal interconnects 136 and vias 138. The number and position of metal interconnects 136, vias 138 and bond pads 118 shown in FIGS. 3 and 5 is by way of example only, and may vary in further embodiments. For example, each first die 112 may include more metal interconnects 136, vias 138 and bond pads 118 than are shown in further embodiments, and may include various other patterns of bond pads 118.

In embodiments, the bond pads 118 may be about 40 μm square and spaced from each other with a pitch of at least 41 μm and larger. For example, the pitch can be 45 μm to 50 μm or larger. It is understood that the size of bond pads 118 and the pitch between bond pads 118 may be other than that in further embodiments. FIG. 3 shows semiconductor dies 112 on wafer 110, and bond pads 118 in a line along one edge of the semiconductor dies 112. The pattern of bond pads 118 are shown for illustrative purposes, and may vary in further embodiments, with the understanding that they are the mirror image of the bond pads 108.

In particular, as explained below, one of the wafers, such as for example wafer 110, may be flipped over and attached to the other wafer, and the bond pads 108, 118 physically attached to each other. As such, it may be necessary relocate the bond pads on one of the wafers in step 216, such as wafer 110, so as to be the mirror image of the bond pads of the other wafer. In further embodiments, the bond pads on respective wafers need not be entirely mirrored on the other. For example, the dies on one wafer may include a few additional bond pads not found on dies of the other wafer. These bond pads may for example be used for redundancy or engineering changes.

In one example, shown in FIGS. 4-5, the vias 138 in both wafers may be fabricated in identical positions relative to each other. In such embodiments, an upper metal interconnect 136a (FIG. 5) at the passivation layer 135 may include elongated portions to couple to the relocated bond pads 118. In further embodiments, the elongated metallization portions 136a may be omitted, and the vias 138 may be repositioned so that the vias 138, upper metal interconnect 136 and bond pads 118 are each the mirror image of vias 128, upper metal interconnect 126 and bond pads 108. It is understood that the elongated portions of the upper metal interconnect may instead be provided within wafer 100 to make the bond pads 108 mirror images of bond pads 118.

In still further embodiments, the wafer 100 may be fabricated identically to wafer 110, but one of the wafers may include a post-processing redistribution layer (RDL) (not shown) added on top of the passivation layer 125 or 135 to redistribute the contact pads 108 or 118 so that the bond pads on respective wafers 100, 110 are the mirror images of each other as shown in FIGS. 2 and 3.

Figure 6:
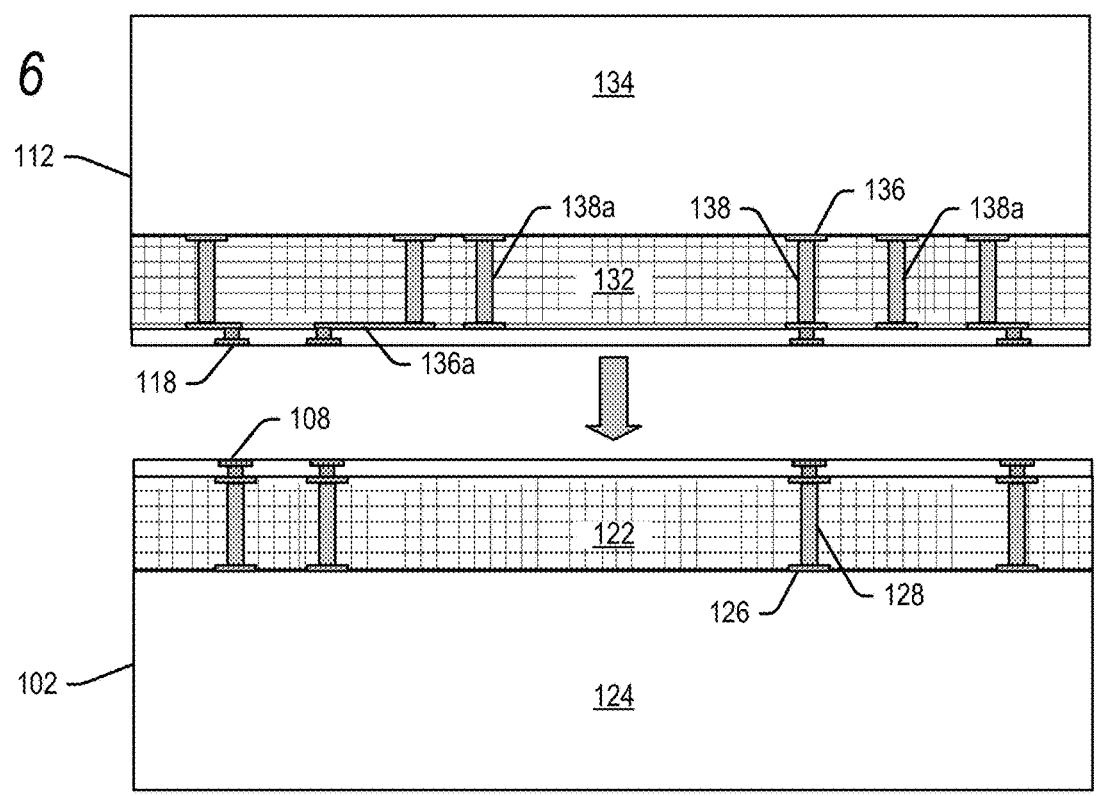
FIGS. 6-7 are cross-sectional edge views of the first and second wafers being joined to form a memory module according to embodiments of the present technology.
Figure 7:
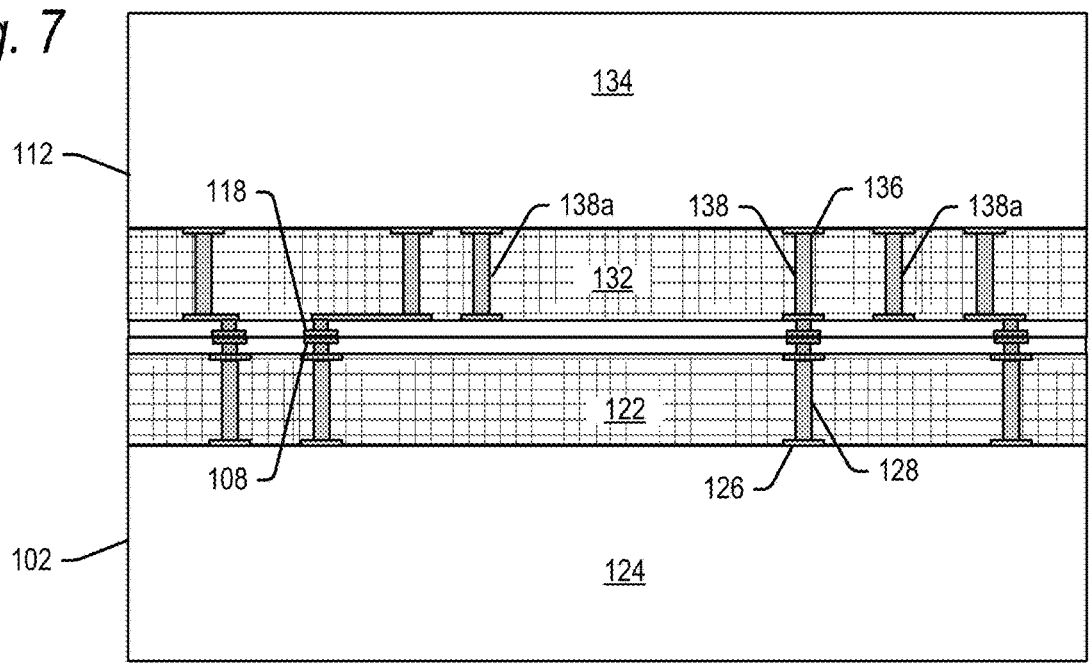

Referring again to the flowchart of FIG. 1, in step 222, one of the wafers (e.g., wafer 110) may be flipped over as shown in FIG. 6, and bonded to the other wafer (e.g., wafer 100) as shown in FIG. 7. Given the orientations shown in the embodiment illustrated in FIGS. 6 and 7, the wafer 100 may be referred to herein as lower wafer 100, including lower semiconductor dies 102, and the wafer 110 may be referred to herein as upper wafer 110, including upper semiconductor dies 112. However, it may be wafer 100 which may be flipped over in further embodiments so that wafer 100 may be referred to as the upper wafer, and wafer 110 may be referred to as the lower wafer. Moreover, as noted above, the designations "upper" and "lower" are arbitrary designations, and may be switched in further embodiments. As noted, the bond pads 108, 118 are mirror images of each other so that the bond pads in each of the dies 102, 112 in respective wafers align with each other once one of the wafers is flipped and bonded to the other.

As explained in greater detail below, although the dies 102, 112 of respective wafers 100, 110 are bonded to become a single physical unit once the wafers are diced, the dies 102, 112 may remain electrically separate components. As is also explained below, shallow vias may be formed in the inactive surface of one of the wafers (e.g., through substrate 134 of upper wafer 110), to form electrical connections extending to the backside surface of the upper wafer 110. Accordingly, each of the bond pads 108 in the lower wafer 100 may have a corresponding bond pad 118 that is used to electrically couple the bond pads 108 and memory array 122 of the lower wafer to the backside surface of the upper wafer. However, there may be more vias 138 in the upper wafer than there are vias 128 in the lower wafer, such that some vias (labeled 138a in FIGS. 6-7) have no corresponding via in the upper wafer. These vias 138a (together with the shallow vias explained below) may be used to electrically couple the memory array 132 in the upper wafer to the backside surface of the upper wafer. As these vias 138a are used only to connect the upper wafer to the backside surface, no corresponding bond pads 118, 108 are needed to couple the lower wafer.

The wafers 100, 110 may be bonded to each other in step 222 by various methods, including for example Cu—Cu bonding, oxide to oxide bonding and hybrid bonding. These processes are known, but in general, in Cu—Cu bonding, the passivation layers 125, 135 around the bond pads are slightly etched so that the bond pads 108, 118 extend above the surfaces of the passivation layers. In a Cu—Cu bonding process, the bond pads 108, 118 are controlled to be highly planar and formed in a highly controlled environment largely devoid of ambient particulates that might otherwise settle on a bond pad 108 and/or 118 and prevent a close bond. The bond pads may for example be cleaned by CMP or particle bombardment techniques to remove any oxide layer and particulates on the surfaces of the bond pads. The bond pads 108, 118 may then be aligned and pressed against each other to form a mutual bond based on surface tension. Such bonds may be formed at room temperature, though heat may also be applied. Cu atoms of joined pads 108, 118 diffuse across the boundary to ensure a secure bond.

Hybrid bonding is similar, but the passivation layers 125, 135 are not etched, and instead remain coplanar with the Cu bond pads. All surfaces are cleaned, for example by CMP, and then the passivation layers 125, 135 and bond pads 108, 118 are pressed together to bond to each other by van der Waals forces. Thereafter, under heat and/or pressure, moisture is removed and covalent bonds form between the passivation layers 125, 135 to permanently bond to each other. Metal-to-metal bonds form between the bond pads 108, 118 to permanently bond them to each other. Other wafer-to-wafer bonding techniques are possible. Such further techniques include various dielectric-to-dielectric bonding techniques including oxide-to-oxide bonding, silicon-to-silicon bonding, and silicon-to-silicon dioxide bonding.

Figure 8:
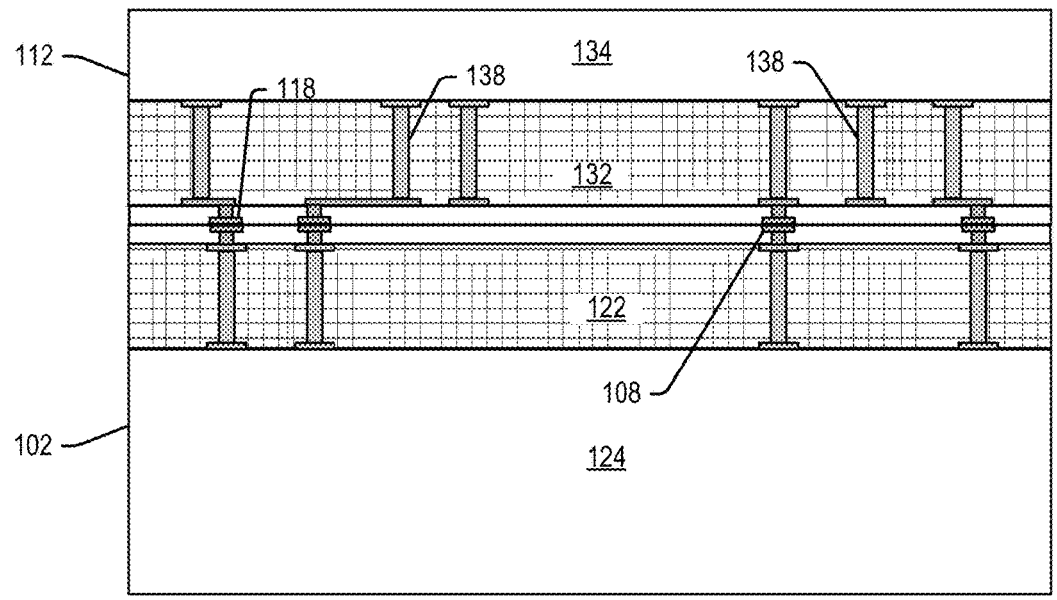
FIG. 8 is a cross-sectional edge view of a memory module after the first wafer is thinned.
Figure 9:
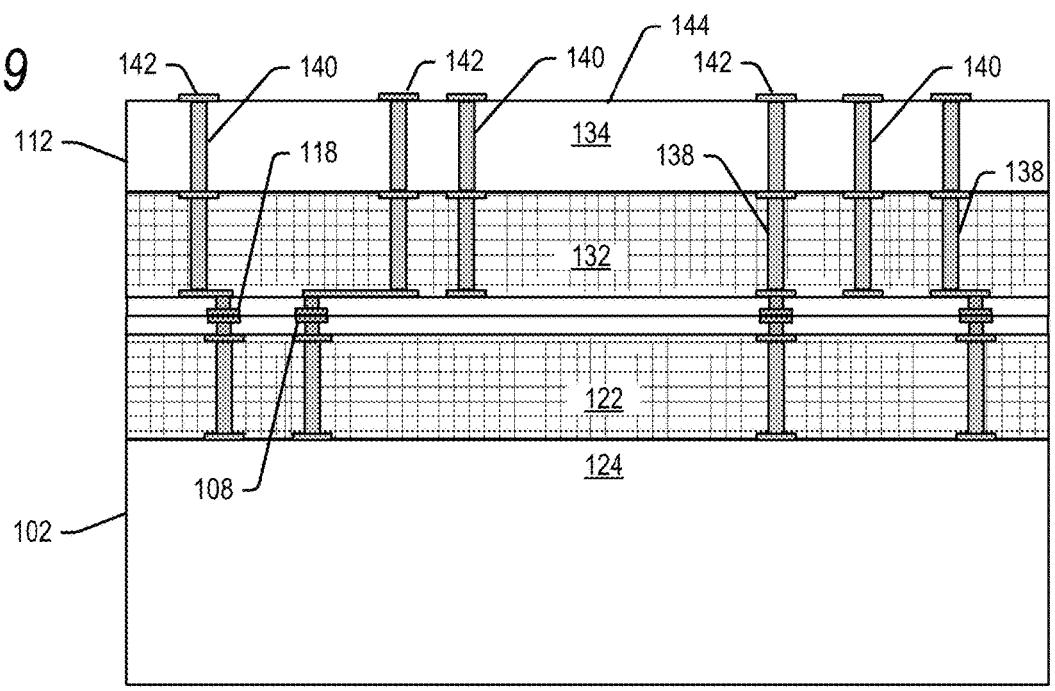
FIG. 9 is a cross-sectional edge view of a memory module after formation of shallow vias in the first wafer.

Once the wafers 100, 110 are bonded to each other, one of the wafers (e.g., upper wafer 110) may undergo a backgrind process in step 226 to thin the substrate layer 134, for example from 760 μm to a final thickness which may range from 10 μm to 4 μm. This structure is shown in FIG. 8. It is understood that the final thickness of substrate layer 134 may be larger or smaller than that range in further embodiments.

In step 230, a pattern of shallow vias 140 may be formed extending through the substrate layer of one of the wafers (e.g., through substrate 134 of wafer 110). The shallow vias 140 extend from metal interconnects 136 at the ends of vias 138, through the substrate 134, and end at the inactive backside surface 144 of wafer 110. The shallow vias 140 may be formed by etching holes through the wafer 110. The holes may then be lined with a barrier against metal diffusion and to provide insulation of the metal conductor from silicon which may be conductive depending on the dopant level. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used. Bond pads 142 may then be formed over the shallow vias 140 at the backside surface 144. Backside inactive surface 144 is also referred to herein as a top surface 144, solely based on the orientations shown in the figures. The pattern of shallow vias 140, and bond pads 142 thereon, are shown by way of example only and may vary in further embodiments.

Figure 10:
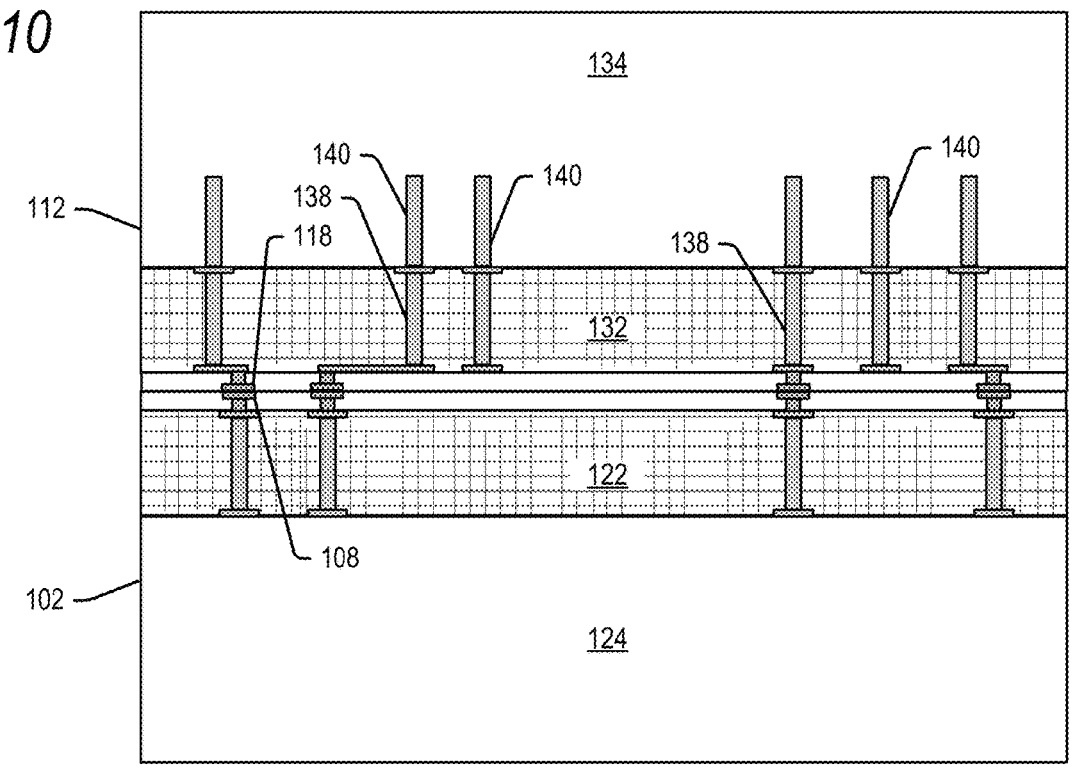
FIGS. 10-11 are cross-sectional edge views showing formation of the shallow vias in the first wafer according to an alternative embodiment of the present technology.
Figure 11:
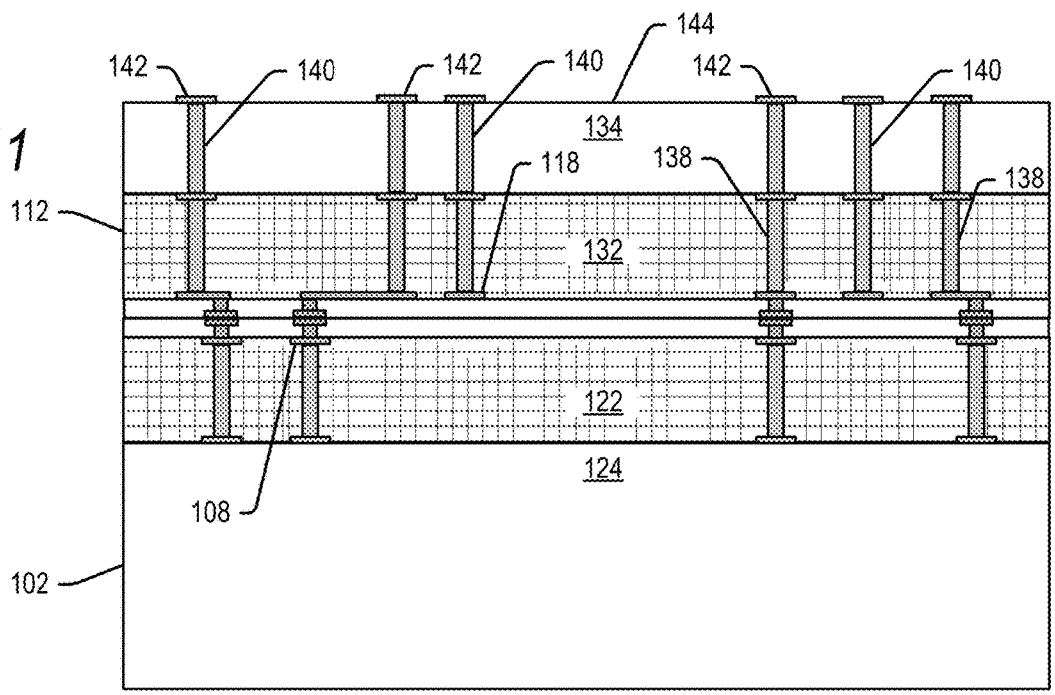

FIGS. 10-11 illustrate an alternative embodiment for forming shallow vias 140. In this embodiment, the shallow vias 140 may be formed at the same time (and possibly as extensions of) vias 138. Specifically, when the metal interconnects 136 and vias 138 are formed within and through the memory cell array 132, the vias 138 may be extended into the substrate 134 to form what will become shallow vias 140 as shown in FIG. 10. The shallow vias 140 may extend into the substrate 134 a distance at least as much or more than the final thickness of the substrate 134 (e.g., at least 4 to 10 μm or more). Thereafter, the wafer 110 may be thinned as described above to reveal the shallow vias 140 as shown in FIG. 11. Bond pads 142 may then be formed over the shallow vias 140 at the top surface 144.

Figure 12:
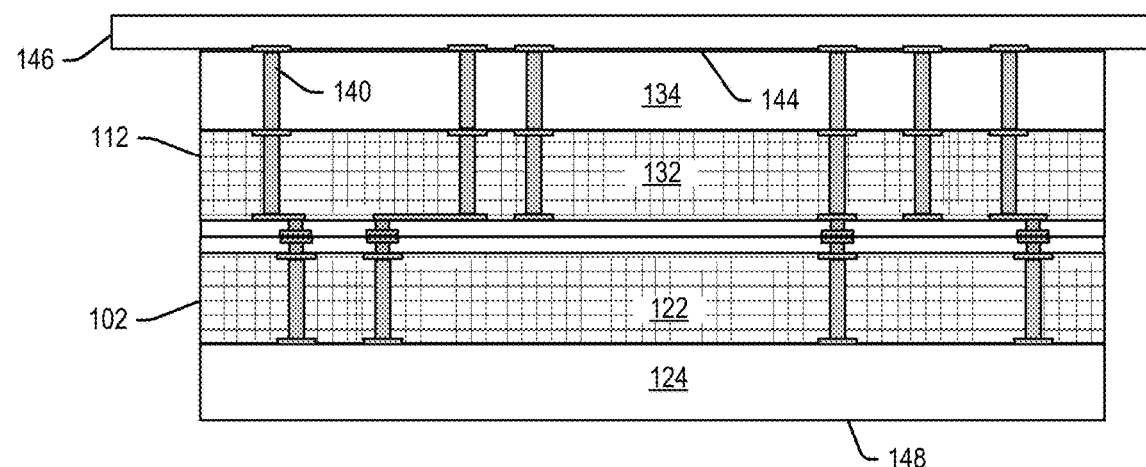
FIG. 12 is a cross-sectional edge view of a memory module affixed to a tape and after the second wafer is thinned according to embodiments of the present technology.

In step 232, the top surface 144 of wafer 110 may be temporarily affixed to a backgrind tape 146 so that the substrate 124 of the wafer 100 may undergo a backgrind process as shown in FIG. 12. The backgrind process thins the substrate layer 124, for example from 760 μm to a final thickness which may range from 10 μm to 4 μm. It is understood that the final thickness of substrate layer 124 may be larger or smaller than that range in further embodiments. After thinning, the substrate layer 124 of wafer 100 may have an exposed surface referred to herein as bottom surface 148, based on the orientations shown in the figures.

Figure 13:
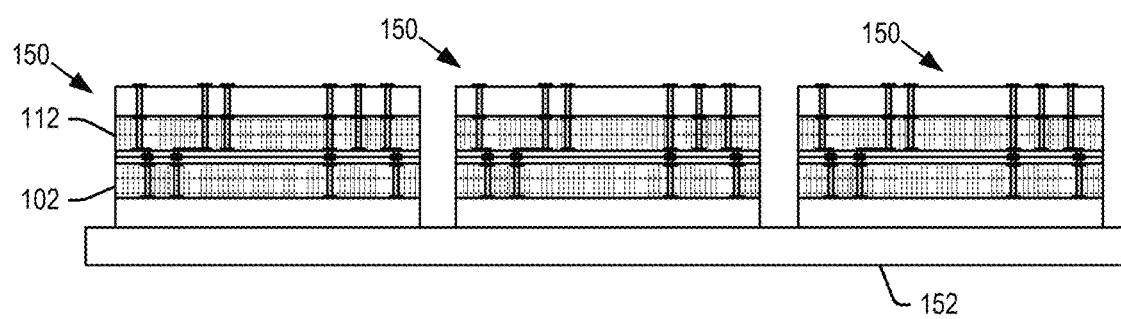
FIG. 13 is a cross-sectional edge view of a plurality of memory modules diced from the wafers and spread on a dicing tape according to embodiments of the present technology.

Although several of the figures show individual semiconductor dies 102, 112 for simplicity, at the stage of fabrication described thus far, the dies 102, 112 are still part of their respective wafers 100, 110. After the backgrind step 232, the backgrind tape 146 may be removed, and the bottom surface 148 of wafer 100 may be supported on a dicing tape 152. Thereafter, in a step 236, the wafers 100, 110 may be diced as shown in FIG. 13 to form individual memory modules 150, each memory module 150 comprising a semiconductor die 102 at a semiconductor die 112.

The wafers 100, 110 may be diced into individual memory modules 150 using for example stealth laser dicing. Saw blades and other traditional methods may be used to dice the memory modules 150 from the wafers 100, 110 in further embodiments. After dicing, the dicing tape 152 may be spread apart to facilitate picking of the memory modules 150 from the dicing tape by a pick and place robot (not shown).

Figure 14:
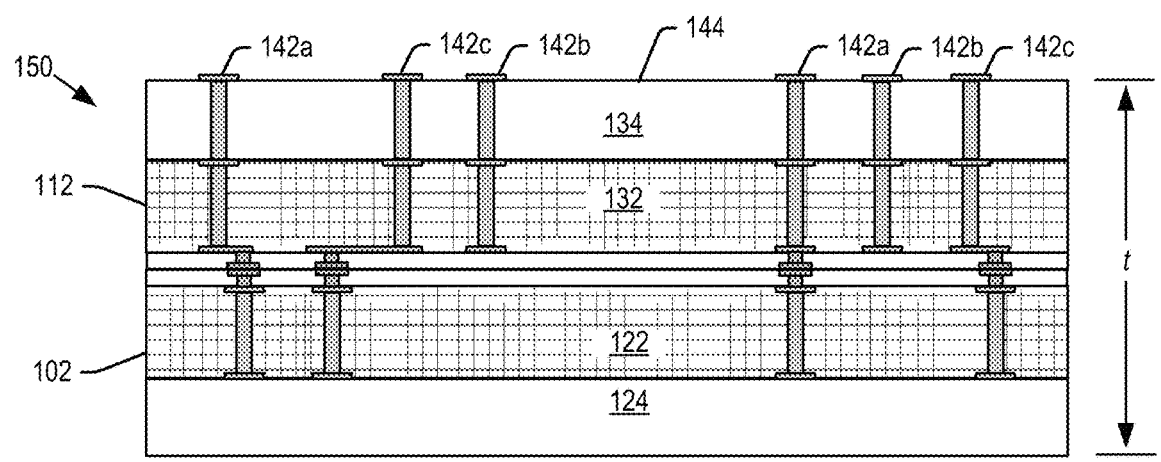
FIG. 14 is a cross-sectional edge view of a completed memory module according to embodiments of the present technology.

FIG. 14 shows a completed memory module 150 according to an embodiment of the present technology. In one embodiment, the memory module 150 may have a total thickness, t, of approximately 36 µm. In one example, this thickness may be comprised of semiconductors die 102, 112, each having a memory array of 12 µm and a substrate of 6 µm. The thicknesses of the memory arrays and substrates of the dies 102, 112, as well as the overall thickness of memory module 150, and may vary in further embodiments. For example, the overall thickness, t, of the memory module 150 may range between 80 µm and 20 µm, depending for example on the memory array thickness and the silicon substrate thickness.

Figure 15:
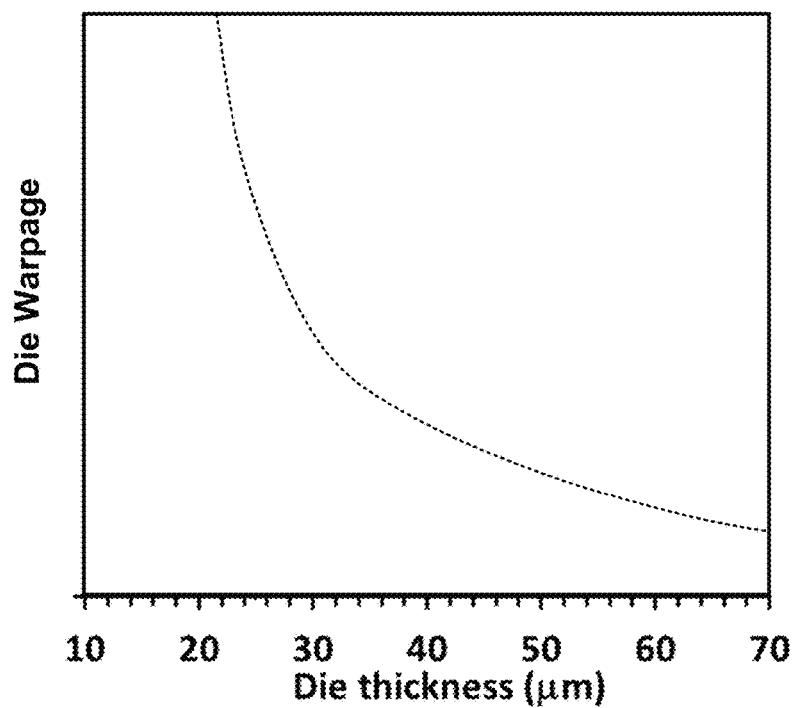
FIG. 15 is a graph of die warpage vs. die thickness.

As noted in the Background section, warping of semiconductor dies becomes a significant problem as semiconductor dies get thinner due to thermal mismatch of the memory array and substrate. FIG. 15 is a graph of die warpage versus die thickness for a BiCS memory device where the memory array has a thickness of about 16 to 17 µm. As this dimension does not change without reducing storage capacity, any reduction in the thickness of a semiconductor die at present may more likely come from reducing a thickness of the substrate layer. As seen in the graph of FIG. 15, for a semiconductor die of 36 µm, the warpage is high, but dies with such warpage can be packaged generally without cracking, and are typically commercially feasible. However, as seen in the graph, warpage nonlinearly increases with further decreases in die thicknesses (i.e., further decreases in substrate thickness). Such warpage would generally result in cracking of the dies when stacked or encapsulated.

In accordance with aspects of the present technology, given the face-to-face mounting of the respective wafers 100, 110 with the active surfaces of the respective wafers face each other, the disparate coefficients of thermal expansion balance each other out, as does the strain otherwise resulting from materials having different thermal coefficients. As a result of this balance, warping of the bonded dies 102, 112 from these wafers is significantly or completely removed. This provides the advantage that the individual semiconductor dies 102, 112 to be made thinner than was feasible in the prior art.

For example, each semiconductor die 102, 112 can have a thickness of 18 µm and, when affixed to each other in accordance with the present technology, have little (about 30 µm) or no warpage. This realization enables two thin semiconductor dies to be affixed to each other with little or no warpage, in the same form factor as a single semiconductor die of the prior art (which has significantly more warpage). Thus, the memory module 150 of the present technology can provide twice the storage capacity as the prior art in this in the same form factor as the prior art. Additionally, as the total thickness of the memory module may be 36 µm, the memory module is thick enough that the issue of chipping and cracking is largely or entirely avoided.

It is a further feature of the present technology to provide a memory module 150 which is physically a single device but electrically can be accesses as a single device or two individual devices. In particular, referring again to FIG. 14, given the configuration of vias, metal interconnects and bond pads within memory module 150, the bond pads 142 on top surface 144 may be used to access die 102 alone, die 112 alone, or both dies 102 and 112. As one example, bond pads 142a may be used to access the memory array 122 of die 102 alone, bond pads 142b may be used to access the memory array 132 of die 112 alone, and bond pads 142c may be used to access the memory arrays 122, 132 of both dies 102 and 112.

Stated another way, the electrical connections in the memory module 150 include a first set of vias and metal interconnects electrically coupled to the bond pads 142b and the first memory array. The first set of vias and metal interconnects are configured to allow access to the first memory array independently of the second memory array. The electrical connections in the memory module 150 include a second set of vias and metal interconnects electrically coupled to the bond pads 142a and the second memory array. The second set of vias and metal interconnects are configured to allow access to the second memory array independently of the second memory array. And the electrical connections in the memory module 150 include a third set of vias and metal interconnects electrically coupled to the bond pads 142c and the first and second memory arrays. The third set of vias and metal interconnects are configured to allow access to the first and second memory arrays together.

It is understood that the embodiment shown in FIG. 14 is by way of example only and a wide variety of other electrical connections of vias, metal interconnects and bond pads may be provided to enable access of die 102 by itself, die 112 by itself, or both dies 102 and 112. It is also possible to interconnect these two dies as an electrically single die connected serially or in parallel.

Referring again to FIG. 1, after the first and second dies 102, 112 are formed and bonded to each other to form integrated memory module 150, the memory module 150 may be tested in step 238 as is known, for example with read/write and burn in operations. Thereafter, the integrated memory modules 150 may be stacked and packaged into a semiconductor device in step 240, possibly including multiple integrated memory modules 150. While a wide variety of packaging configurations are known, FIG. 16 shows one such example.

Figure 16:
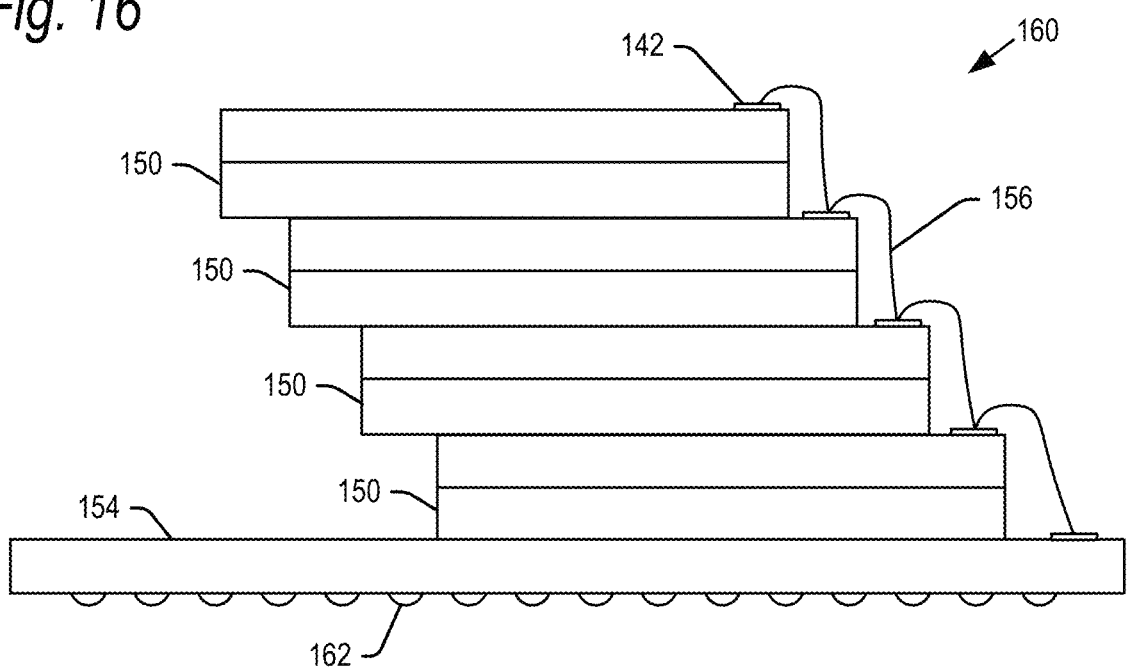
FIG. 16 is a cross-sectional edge view of a plurality of memory modules stacked on a substrate according to embodiments of the present technology.

FIG. 16 shows a semiconductor device 160 including a number of integrated memory modules 150 stacked on each other and a substrate 154, for example using a die attach film (DAF) on a bottom surface of the first semiconductor dies 102 of each module 150. The illustrated embodiment includes 4 memory modules 150, but may alternatively include, 1, 2, 8, 16, 32, 64 or other numbers of memory modules. The integrated memory modules 150 may for example be stacked with a stepped offset, leaving the bond pads 142 at each level uncovered and accessible from above. The integrated memory modules 150 may then be wire bonded to each other and the substrate 154 in step 242, using wire bonds 156 affixed to the bond pads 142 at each level. A number of such wire bonds may be formed across the width of each integrated memory module 150 (i.e., into the page of FIG. 16).

Figure 17:
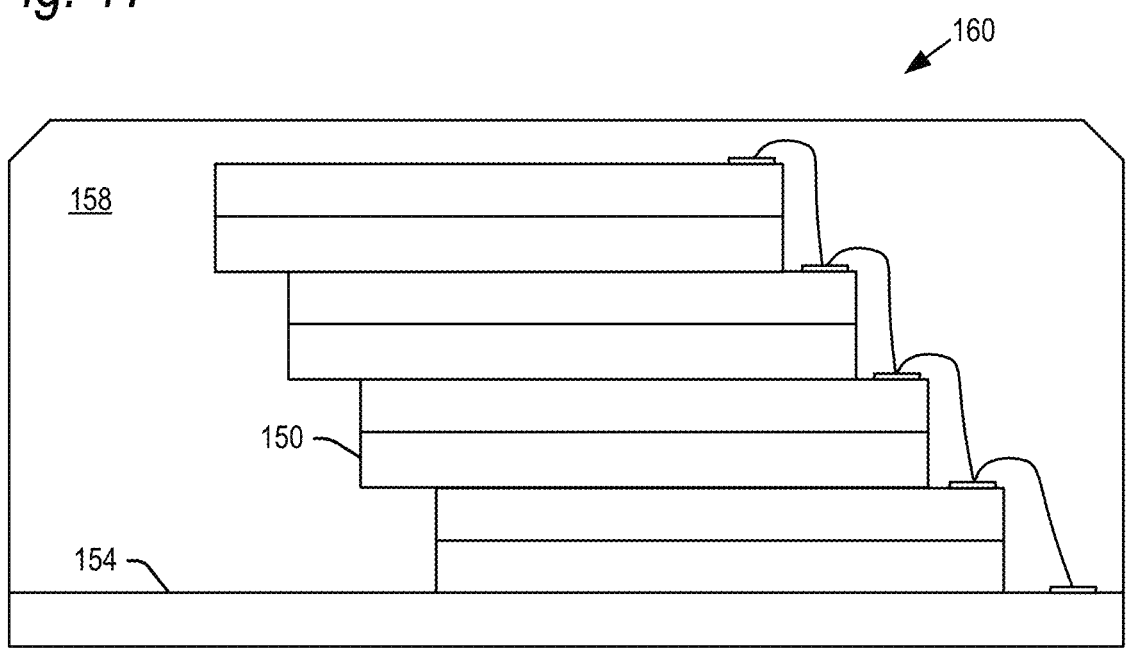
FIG. 17 is a cross-sectional edge view of a finished semiconductor device according to embodiments of the present technology.

Once the wire bonds are formed, the memory arrays 150 and bond wires 156 may be encapsulated in a mold compound 158 as shown in FIG. 17 to form a completed semiconductor device 160. The encapsulation may be provided to encase and protect the various dies 102 and 112 as well as bond wires 156. Solder balls 162 may optionally be affixed to contact pads on a lower surface of substrate 154 of the semiconductor device 160. The solder balls 162 may be used to electrically and mechanically couple the semiconductor device 160 to a host device (not shown) such as a printed circuit board. Solder balls 162 may be omitted where the semiconductor device 160 is to be used as an LGA package.

In embodiments described above, electrical connections are made through the dies 102 and 112 to a top surface 144 as shown for example in FIG. 14. Thereafter, the dies 102, 112 may be stacked and electrically accessed via wire bonds 156 on bond pads 142 on the top surface 144 as shown for example in FIG. 16. FIGS. 18-22 show a further embodiment of the present technology, where electrical connections are made through the dies 102, 112 to both a top surface 144 and a bottom surface 148 of the memory module 150.

Figure 18:
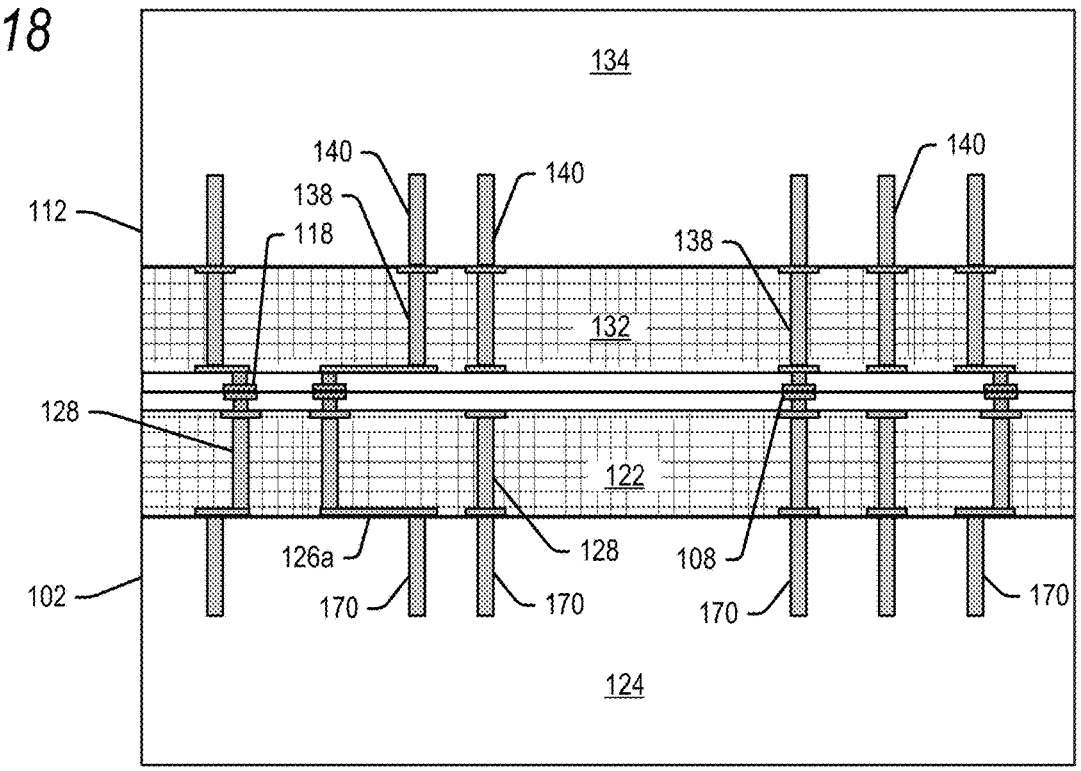
FIGS. 18-20 are cross-sectional edge views showing fabrication of a memory module according to alternative embodiments of the present technology.

As seen in FIG. 18, a pattern of shallow vias 140, 170 may be formed extending through the substrate layers of both of the wafers 100 and 110. The shallow vias 140 may be formed in wafer 110 as described above, for example with reference to FIGS. 10 and 11. That is, the shallow vias 140 may for example be formed at the same time (and possibly as extensions of) vias 138. Shallow vias 170 may similarly be formed at the same time (and possibly as extensions of) vias 128. Shallow vias 170 may be formed in the same manner, and of the same materials, as any of the embodiments of vias 140 described above. The shallow vias 170 may extend into the substrate 124 a distance at least as much or more than the final thickness of the substrate 124 (e.g., at least 4 to 10 μm or more).

Figure 19:
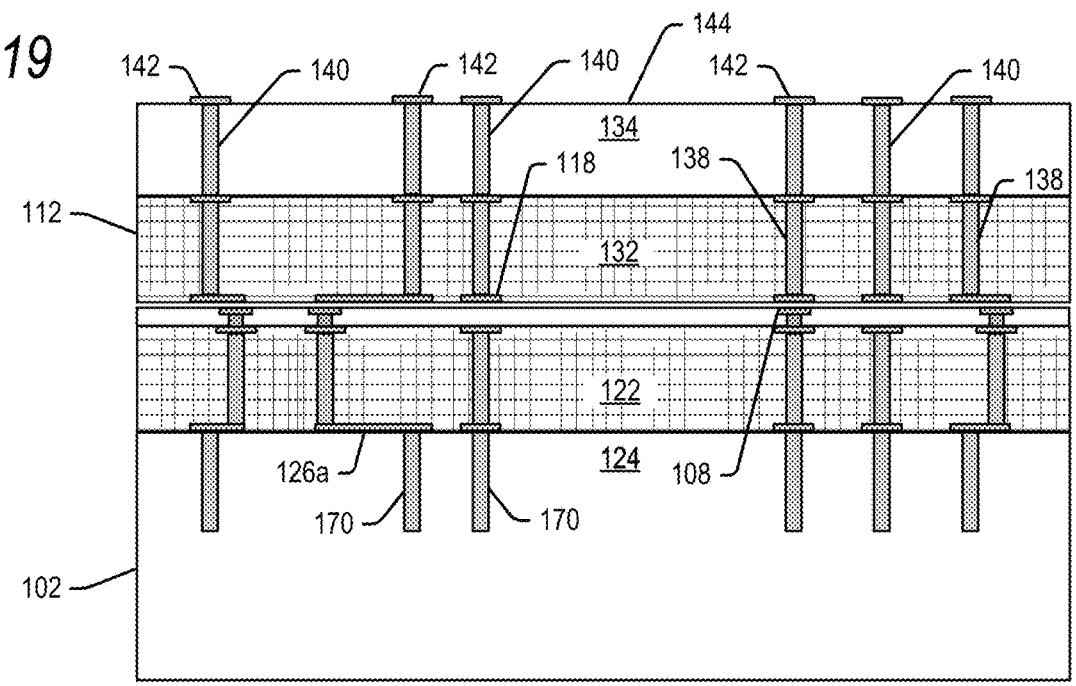
Figure 20:
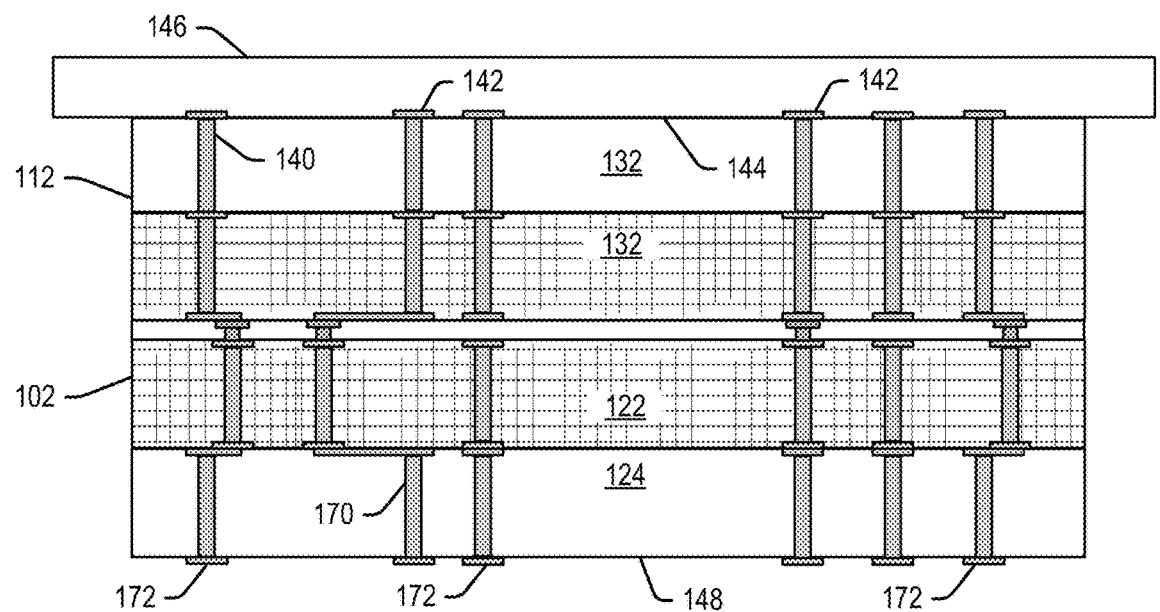

Thereafter, the wafer 110 may be thinned as described above to reveal the shallow vias 140 as shown in FIG. 19. Bond pads 142 may then be formed over the shallow vias 140 at the top surface 144 as described above. The top surface 144 of wafer 110 may then be temporarily affixed to a backgrind tape 146 so that the substrate 124 of the wafer 100 may undergo a backgrind process as shown in FIG. 20. The backgrind process thins the substrate layer 124, for example from 760 μm to a final thickness which may range from 10 μm to 4 μm. It is understood that the final thickness of substrate layer 124 may be larger or smaller than that range in further embodiments. Thinning of the wafer 110 reveals the shallow vias 170 in the bottom surface 148. Thereafter, bond pads 172 may be formed over the shallow vias 170 at the bottom surface 148. The pattern of shallow vias 170, and bond pads 172 thereon, is shown by way of example only and may vary in further embodiments.

Figure 21:
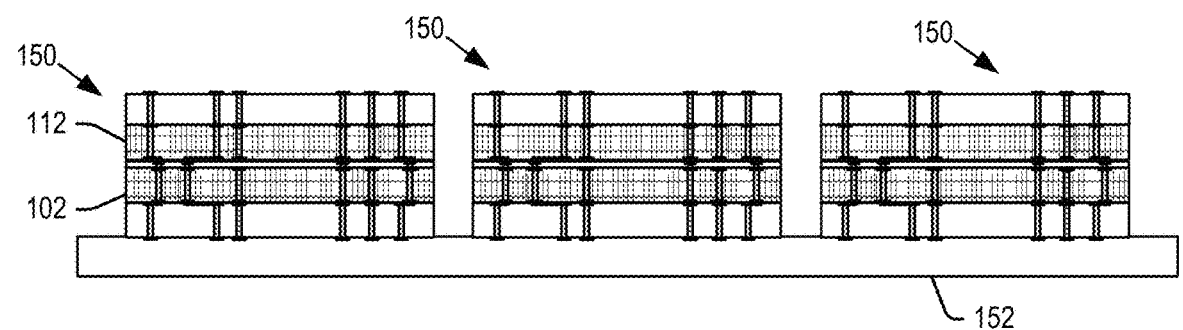
FIG. 21 is a cross-sectional edge view of a plurality of memory modules diced from the wafers and spread on a dicing tape according to the alternative embodiment of FIGS. 16-19.
Figure 22:
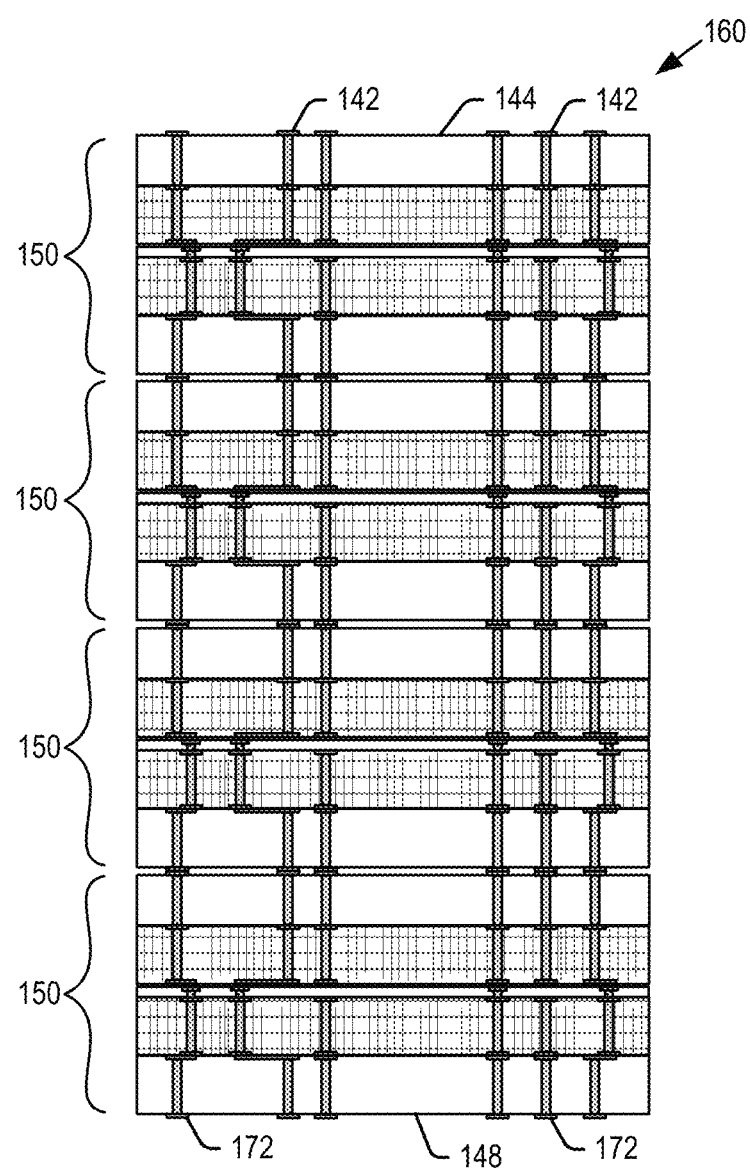
FIG. 22 is a cross-sectional edge view of a plurality of memory modules stacked according to the alternative embodiment of FIGS. 16-19.

After the backgrind step, the backgrind tape 146 may be removed, and the bottom surface 148 of wafer 100 may be supported on a dicing tape 152 as shown in FIG. 21. Thereafter, the wafers 100, 110 may be diced as described above to form a completed memory module 150. After dicing, the memory modules may be stacked and packaged into a semiconductor device 160 as shown in FIG. 22. An advantage of the embodiment shown in FIGS. 18-22 is that the memory modules 150 may be stacked in a chip scale package, meaning a package substrate may be omitted, and the footprint of the finished semiconductor device 160 may be the footprint of the memory module stack. This is made possible by the vias 138, 140, 128, 170 which together extend entirely through each memory module from the bottom surface 148 to the top surface 144. These vias together form through-silicon vias (TSVs).

The TSVs allow individual memory modules 150 to be stacked directly atop each other, with the bond pads 142 of a lower memory module being coupled directly to the bond pads 172 of the next higher memory module. Solder bumps may optionally be provided on bond pads 142 to facilitate bonding of the next higher memory module. An advantage of using TSVs is that the memory modules are electrically connected without having to use wire bonds, and without having to offset step each memory module to make room for the wire bonds, thus decreasing the footprint of the finished semiconductor device 160.

In embodiments described above, the dies 102 and 112 of wafers 100 and 110 are purely flash memory dies, such as for example 2D or 3D (e.g., BiCS) flash memory dies. In further embodiments, dies may be used according to the present technology that further incorporate logic circuitry into one or more flash memory dies. Such embodiments will now be described with respect to FIGS. 23-27.

Figure 23:
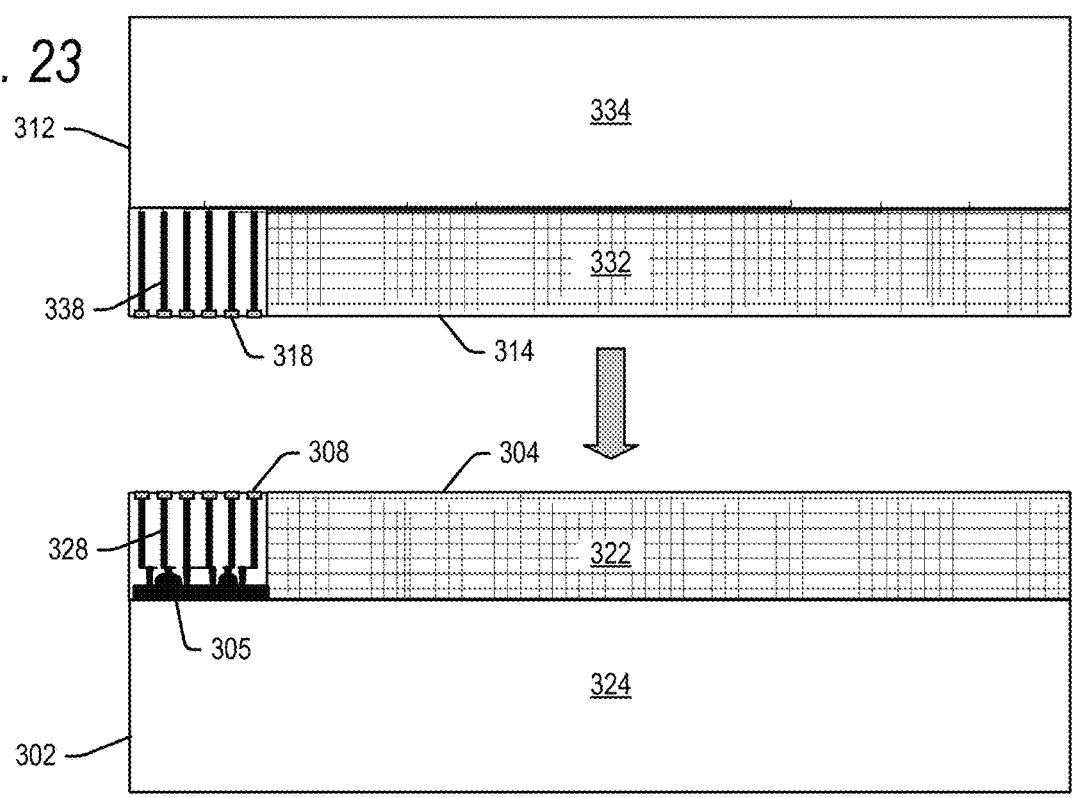
FIGS. 23-25 are cross-sectional edge views of first and second wafers being joined to form a CMOS memory module according to further embodiments of the present technology.

Referring initially to cross-sectional edge view of FIG. 23, there is shown a first semiconductor die 302 and a second semiconductor die 312. At this stage in the fabrication, the first semiconductor die 302 may be part of a first semiconductor wafer, and the second semiconductor die 312 may be part of a second semiconductor wafer. FIG. 23 shows a single die 302 from the first wafer and a single die 312 from the second wafer. The first and second semiconductor wafers may be processed to include integrated circuits on and in a substrate which may for example be silicon dioxide.

For example, each semiconductor die 302 from the first wafer may include integrated circuit memory cell array 322 formed in a dielectric substrate 324. The substrate 324 may for example be or include silicon, such as silicon dioxide, but may be or include other materials in further embodiments. The memory cell array 322 may be formed as a 3D stacked memory structure having strings of memory cells formed into layers as described above with respect to memory cell array 122.

In addition to the memory cell array 322, the dies 302 in the first wafer may further include logic circuits 305. The logic circuits 305 may have circuitry used for controlling and driving memory elements of the memory cell arrays to accomplish functions such as programming and read/write operations. The logic circuits 305 may for example be fabricated using complementary metal—oxide—semiconductor (CMOS) technology, and be formed next to the memory cell array 322 in substrate 324 as shown in FIG. 23. The logic circuits 305 may be fabricated using other technologies in further embodiments.

The logic circuits 305 may be electrically coupled to the memory cell array 322 by a network of metal interconnects and/or vias (not shown) formed in the substrate 324 of die 302. The logic circuits 305 may also be coupled to a memory cell array 332 in the second semiconductor die 312 as described below. For this purpose, a series of fine-pitch vias 328 may be formed over the logic circuits 305, which vias 328 are coupled to fine pitch bond pads 308 on an active surface 304 of die 302. The vias 328 may be formed using materials, and in a manner, as described above with respect to the vias 128. The bond pads 308 may for example be 3 to 5 μm square, with a pitch of 1 to 5 microns between them. It is understood that the size and pitch of bond pads 308 may vary outside of these ranges in further embodiments.

The second semiconductor dies 312 in the second wafer may be processed to include integrated circuit memory cell array 332 formed in a dielectric substrate 334 as shown in FIG. 23. The substrate 334 may for example be or include silicon, such as silicon dioxide, but may be or include other materials in further embodiments. The memory cell array 332 may be formed as a 3D stacked memory structure having strings of memory cells formed into layers as described above with respect to memory cell array 122. However, it is understood that the second semiconductor dies 312 may be processed to include integrated circuits other than a 3D stacked memory structure.

In order to connect the memory cell array 332 in die 312 to logic circuits provided in die 302, die 312 may further include a series of fine-pitch vias 338 next to the memory cell array 332, which vias 338 are coupled to fine pitch bond pads 318 on an active surface 314 of die 312. The vias 338 may be formed using materials, and in a manner, as described above with respect to the vias 128. The bond pads 318 may match the size, position and pitch of bond pads 308 in die 302. The vias 338 may be electrically coupled to the memory cell array 332 by a network of metal interconnects and/or vias (not shown) coupled between the vias 338 and the array 332.

Figure 24:
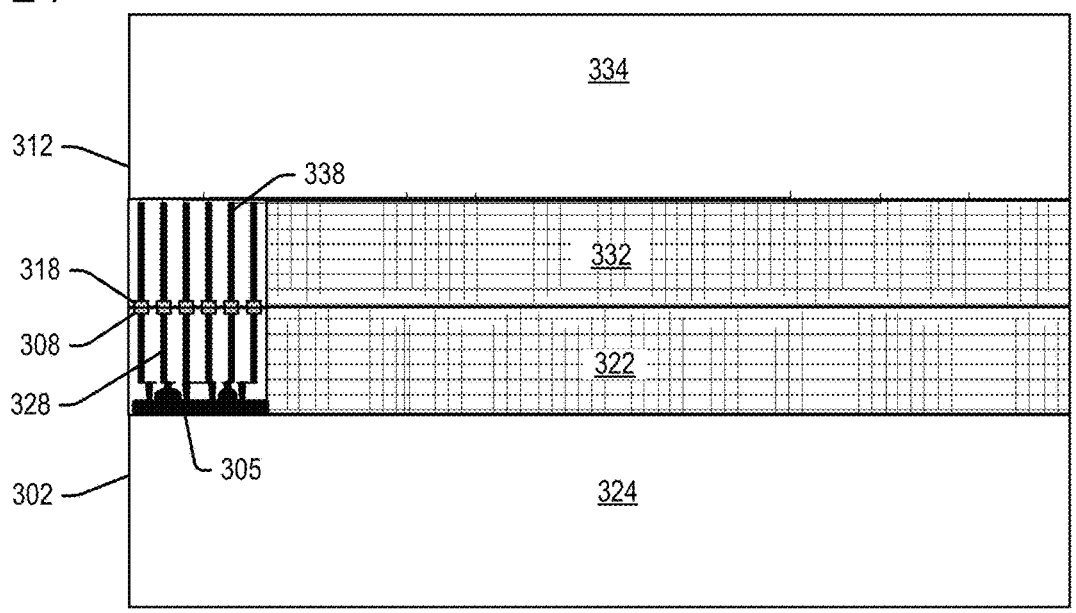

As indicated by the arrow in FIG. 23, the second wafer including semiconductor dies 312 may be mounted on top of the first wafer including semiconductor dies 302 as shown in the cross-sectional edge view of FIG. 24. The first and second wafers may be bonded to each other using Cu—Cu bonding, oxide to oxide bonding or hybrid bonding techniques described above to physically couple the first and second wafers together and to physically and electrically couple respective pairs of bond pads 308 and 318.

Figure 25:
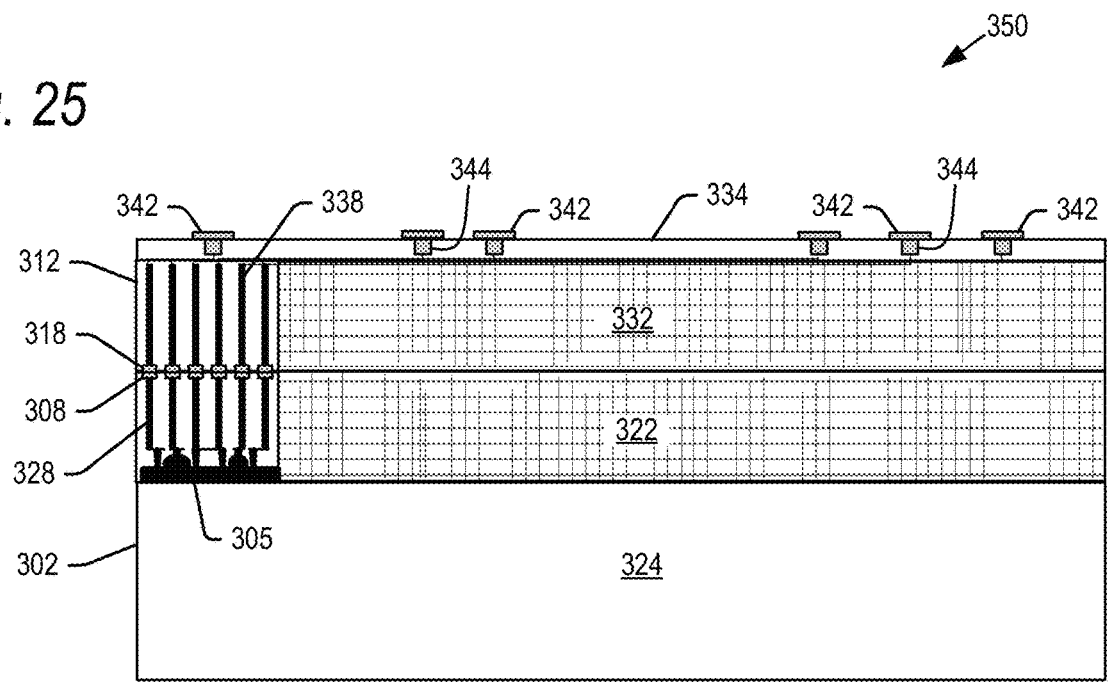

Referring now to FIG. 25, with the bottom surface of substrate 324 supported on a backgrind tape, the upper surface of substrate 334 may be thinned to a final thickness of for example 1 to 10 µm, including for example 2 µm. Bond pads 342 may be formed on the top surface of substrate 334 after thinning. Each of the bond pads 342 may be formed on top of a shallow via 344, which shallow vias may be electrically coupled to the vias 338 by metal interconnects formed in substrate 334. After formation of the bond pads 342, the backgrind tape may be switched from the bottom surface of substrate 324 to the top surface of substrate 334, and the substrate 324 may be thinned in a backgrind process to, for example, 20 µm, though other thicknesses are possible. The memory cell array 322 and the memory cell array 332 may each be about 10 µm. It is understood each of these dimensions may vary in further embodiments.

After the first and second wafers including dies 302 and 312 are fabricated as described above, the individual coupled dies 302 and 312 may be diced from the wafers to form a finished CMOS memory module 350 as shown in FIG. 25. The logic circuits 305 in die 302 may communicate with and control the memory cell arrays 322 and 332 by the vias 328, the bond pads 308, 318 and the vias 338. A host device (not shown) may also communicate with the logic circuit 305 and/or memory cell arrays 332, 322 by the bond pads 342, the shallow vias 344, the vias 338, the bond pads 308, 318 and the vias 328.

A number of such CMOS memory modules may be stacked and packaged together as shown for example in FIG. 16. Such a package may thereafter be encapsulated to form a completed semiconductor device as shown for example in FIG. 17. In further embodiments, in addition to the shallow vias 344 in top substrate 334, shallow vias may also be formed through the bottom substrate 324 to provide TSVs through the CMOS memory module 350 as shown for example in FIGS. 18-21. This would enable CMOS memory modules 350 to be stacked in a chip scale package as shown for example in FIG. 22.

In FIGS. 23-25, the control circuits 305 were located next to the memory cell array 322 in die 302 in a so-called CNA (CMOS next to array) configuration. In a further embodiment, the control circuits 305 may be located beneath the memory cell array 322 in dies 302. In a still further embodiment, the control circuits 305 may be fabricated alone, on a completely separate semiconductor wafer from the one or more wafers including the memory cell arrays. Such an embodiment will now be described with reference to FIGS. 26-28.

Figure 26:
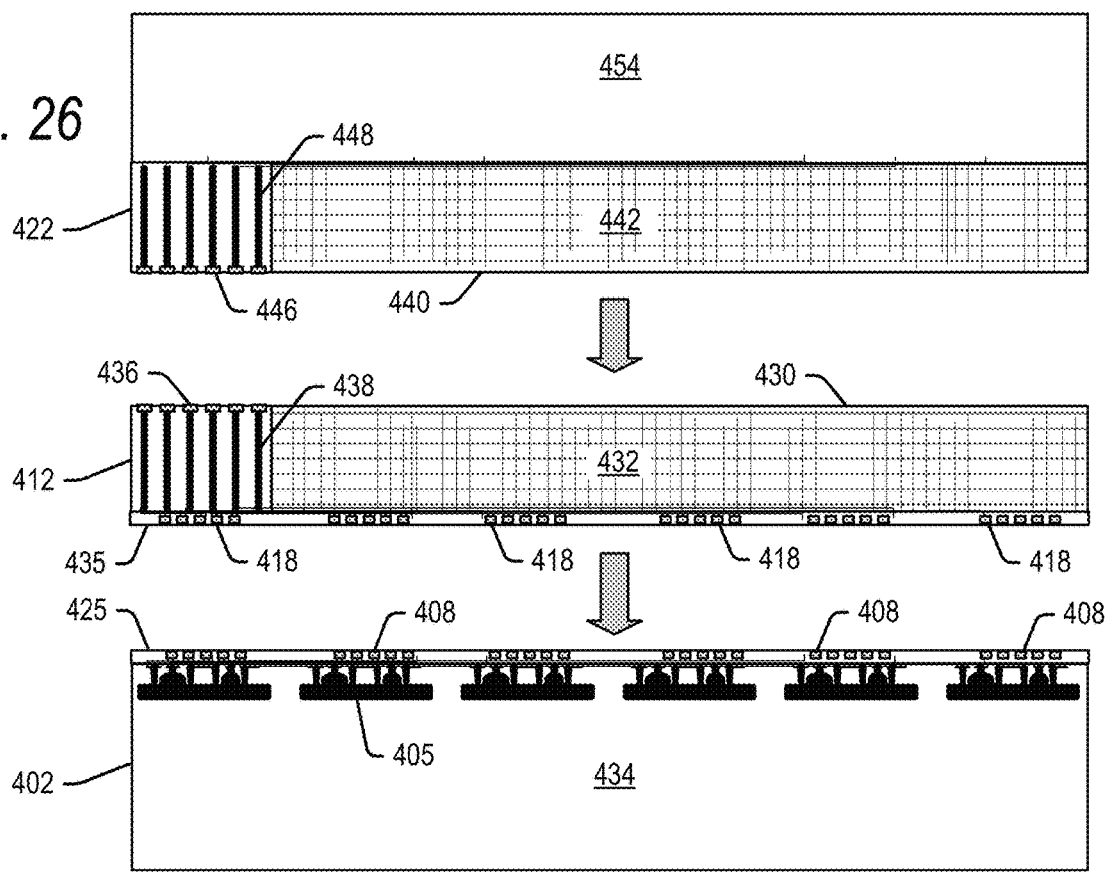
FIGS. 26-28 are cross-sectional edge views of first, second and third wafers being joined to form a CMOS memory module according to a further alternative embodiment of the present technology.
Figure 27:
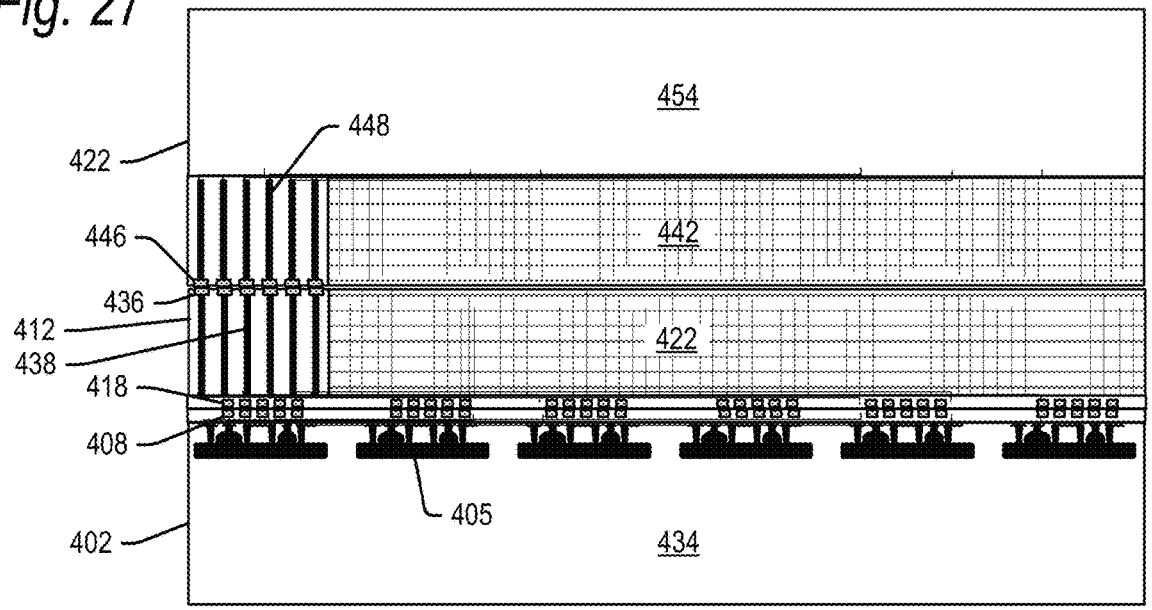
Figure 28:
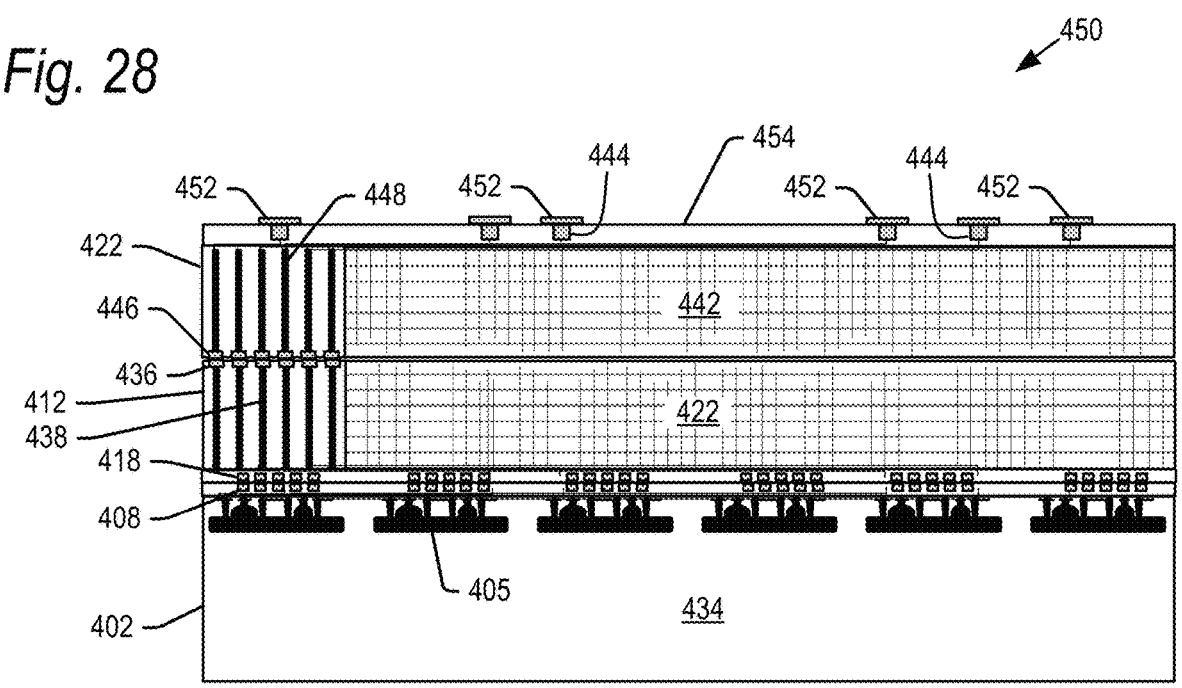

The embodiment of FIGS. 26-28 is formed from three separate wafers, the first wafer including semiconductor dies 402, the second wafer including semiconductor dies 412, and the third wafer including semiconductor dies 422. The semiconductor dies 402 of the first semiconductor wafer may include integrated circuits comprised entirely of logic circuits 405. Logic circuits 405 may for example be CMOS circuits, or any of the configurations described above with respect logic circuits 305. The logic circuits 405 may be formed in a substrate 434, which may for example be silicon such as silicon dioxide. Bond pads 408 may be formed in a passivation layer 425 on top of the logic circuits 405, which bond pads 408 are electrically coupled to the logic circuits 405.

The semiconductor dies 412 of the second wafer may include memory cell array 432 formed next to a network of fine pitch vias 438. The memory cell array 432 may for example have the same composition as any of the embodiments of memory cell array 122 described above. Fine pitch bond pads 436 may be formed on top of vias 438 in an upper surface 430 of dies 412. The vias 438 may be formed using materials, and in a manner, as described above with respect to the vias 128. The bond pads 436 may for example be 0.5 to 2.5 µm square, with a pitch of 1 to 5 microns between them. It is understood that the size and pitch of bond pads 436 may vary outside of these ranges in further embodiments. Bond pads 418 may be formed in a passivation layer 435 beneath the memory cell array 432 and vias 438, which bond pads 418 may match the size position and pattern of bond pads 408 on dies 402. The bond pads 418 may be electrically coupled to the memory cell array 432 and/or vias 438.

Semiconductor dies 412 on the second wafer may initially include a substrate which may be removed in a backgrind process to provide the semiconductor dies 412 shown in the second wafer in FIG. 26. The substrate may be removed before the second wafer is affixed to the first wafer (as explained below) by attaching the passivation layer 435 to a backgrind tape and then thinning the opposed surface. Alternatively, the substrate may be removed after the second wafer is affixed to the first wafer (as explained below) by attaching the bottom surface of substrate 434 to a backgrind tape and then thinning the opposed surface.

The semiconductor dies 422 of the third wafer may include memory cell array 432 formed in a substrate 454 made of silicon or other suitable material. The memory cell array 442 may for example have the same composition as any of the embodiments of memory cell array 122 described above. A network of fine pitch vias 448 may be formed next to the memory cell array 442. Fine pitch bond pads 446 may be formed on the bottom of vias 448 in a lower surface 440 of dies 422. The vias 448 may be formed using materials, and in a manner, as described above with respect to the vias 128. The bond pads 446 may match the size, position and pattern of bond pads 436 in die 412. In one example, the bond pads 446 may for example be 3 to 5 µm square, with a pitch of 1 to 5 microns between them.

As indicated by the arrows in FIG. 26, the semiconductor dies 412 in the second wafer may be mounted on top of the semiconductor dies 402 in the first wafer, and the semiconductor dies 422 in the third wafer may be mounted on top of the semiconductor dies 412 in the second wafer, as shown in the cross-sectional edge view of FIG. 27. As noted above, the second wafer may be thinned to remove the substrate layer before being joined to the first wafer. Alternatively, the second wafer may be joined to the first wafer, and then thinned. Once the second wafer is thinned, the third wafer may be bonded to the second wafer.

The first, second and third wafers may be bonded to each other using Cu—Cu bonding or hybrid bonding techniques described above to physically couple the first, second and third wafers together. During the bonding process, the bond pads 418 in the dies 412 of the second wafer may be physically and electrically coupled to bond pads 408 of dies 402 in the first wafer. During the bonding process, the bond pads 446 in dies 422 of the third wafer may be physically and electrically coupled to the bond pads 436 in dies 412 of the second wafer.

Referring now to FIG. 28, with the bottom surface of substrate 434 supported on a backgrind tape, the upper surface of substrate 454 may be thinned to a final thickness of for example 1 to 10 μm, including for example 2 μm. Bond pads 452 may be formed on the top surface of substrate 454 after thinning. Each of the bond pads 452 may be formed on top of a shallow via 444, which shallow vias may be electrically coupled to the vias 448 by metal interconnects formed in substrate 454. After formation of the bond pads 452, the backgrind tape may be switched from the bottom surface of substrate 434 to the top surface of substrate 454, and the substrate 434 may be thinned in a backgrind process to, for example, 20 μm, though other thicknesses are possible. The memory cell array 432 and the memory cell array 442 may each be about 10 μm. It is understood each of these dimensions may vary in further embodiments.

After the first, second and third wafers including dies 402, 412 and 422 are fabricated as described above, the individual coupled dies 402, 412 and 422 may be diced from the wafers to form a finished CMOS memory module 450 as shown in FIG. 28. The logic circuits 405 in die 402 may communicate with and control the memory cell arrays 432 and 442 in dies 412 and 422 by the bond pads 408, 418, the vias 438, the bond pads 436, 446 and the vias 448. A host device (not shown) may also communicate with the logic circuit 405 and/or memory cell arrays 442, 422 by the bond pads 452, the shallow vias 444, the bond pads 408, 418, the vias 438, the bond pads 436, 446 and the vias 448.

A number of such CMOS memory modules may be stacked and packaged together as shown for example in FIG. 16. Such a package may thereafter be encapsulated to form a completed semiconductor device as shown for example in FIG. 17. In further embodiments, in addition to the shallow vias 444 in substrate 454, shallow vias may also be formed through the bottom substrate 434 to provide TSVs through the CMOS memory module 450 as shown for example in FIGS. 18-21. This would enable CMOS memory modules 450 to be stacked in a chip scale package as shown for example in FIG. 22.

The embodiments of the CMOS memory modules 350 and 450 shown in FIGS. 23-28 show two sets of memory cell arrays controlled by the logic circuits 305, 405. In further embodiments, it is contemplated that more than two memory cell arrays may be controlled by a logic circuit. In such embodiments, each memory cell array may be in its own semiconductor die bonded to each other and the logic circuit. The logic circuit may be to the side of one of the memory cell arrays (as shown in FIG. 25), or the logic circuit may be beneath one of the memory cell arrays (as shown in FIG. 28). In embodiments where more memory cell arrays are controlled, there may be more vias (328, 338, 438, 448) and more bond pads (308, 318 and 408, 418) than are shown in FIGS. 23-28.

Figure 29:
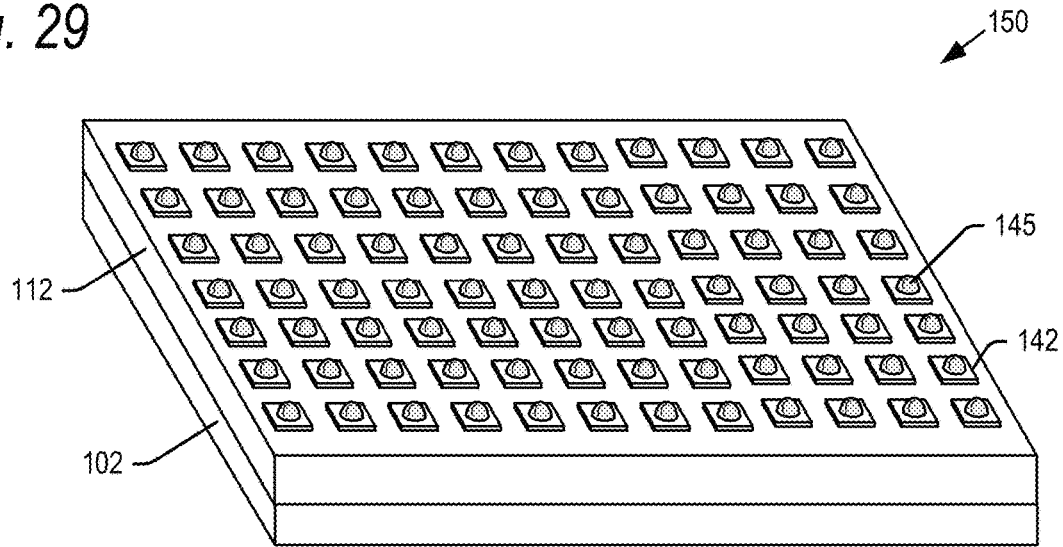
FIG. 29 is a perspective view of a top surface of a memory module according to embodiments of the present technology.

In embodiments of the present technology described above, the bond pads on a top surface of the memory module (e.g., bond pads 142, FIG. 16) may be provided along an edge of the memory module. In further embodiments, the bond pads on a top surface of any of the memory modules described above may be formed in a variety of other patterns for example, FIG. 29 shows a grid pattern of bond pads 142 on an upper surface of a memory module 150. The grid pattern shown in FIG. 29 is by way of example only and a variety of other patterns may be provided. Where memory modules 150 are stacked as shown for example in FIG. 16, the grid pattern of bond pads 142 may be provided on the uppermost memory module 150 in the stack, with the lower memory modules having bad bond pads 142 along only a single edge. Memory modules 350 and 450 described with respect to FIGS. 23-28 may similarly have a pattern of bond pads (342, 452) as shown in FIG. 29.

Figure 30:
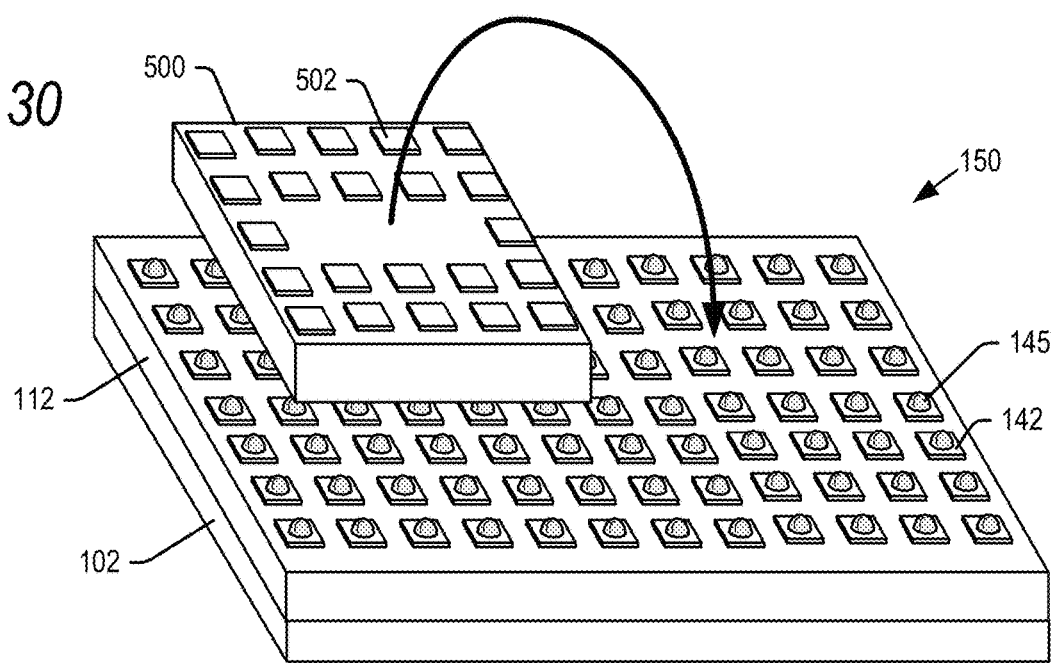
FIG. 30 is a perspective view of an electronic component to be flip-chip bonded to a top surface of a memory module according to embodiments of the present technology.

In accordance with a further aspect of the present technology, the pattern of bond pads on an upper surface of a memory module 150, 350, 450 allows a further electronic component 500 to be flip chip bonded on the upper surface of the memory module. FIG. 30 shows electronic component 500 including a pattern of bond pads 502 configured to mate with bond pads 142 on the upper surface of memory module 150. The pattern of bond pads 502 is shown by way of example only and may vary in further embodiments.

Figure 31:
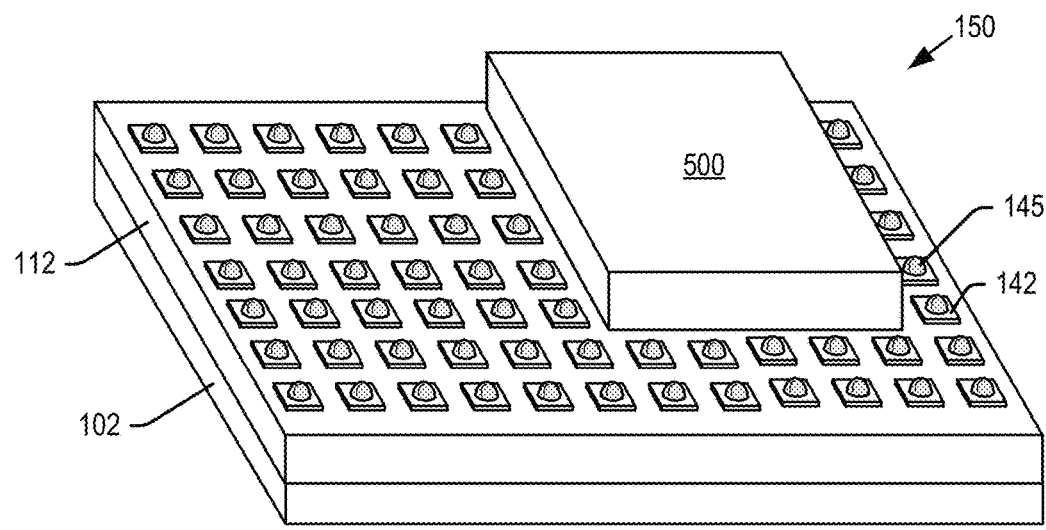
FIG. 31 is a perspective view of an electronic component flip-chip bonded to a top surface of a memory module according to embodiments of the present technology.

Solder bumps 145 may be provided on the upper surfaces bond pads 142 as shown in FIGS. 29 and 30. Thereafter, the electronic component 500 may be mounted to the upper surface bond pads 142 by joining the bond pads 502 (flipped over from the perspective shown in FIG. 30), and applying heat and/or pressure to melt the solder bumps 145. FIG. 31 shows an electronic component 500 bonded to the bond pads 142 on an upper surface of the memory module 150. Solder bumps 145 may be provided on all upper surface bond pads, or only on those upper surface bond pads which mate with the bond pads 502 of the electronic component 500.

Electronic component 500 may be any of a wide variety of electronic components. In one example, electronic component 500 is a controller semiconductor die such as an ASIC for controlling the operation of the memory module 150. In further embodiments, the electronic component may for example be an AI (artificial intelligence) semiconductor chip. Such chips may be used to implement artificial intelligence processes with respect to data stored on the memory module 150 (or memory modules 350 or 450). Such AI processes have traditionally been performed by processors that are separate from the memories that store the data to which the AI processes are directed. By integrating an AI chip directly on to memory module 150, the AI chip may perform AI operations on the data stored on module 150 in a fraction of the time in comparison to traditional systems.

Figure 32:
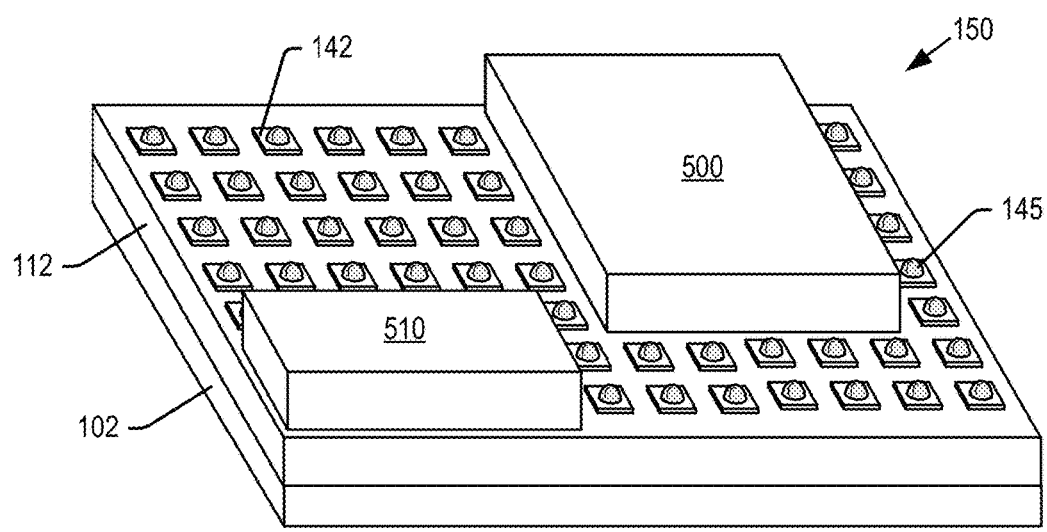
FIG. 32 is a perspective view of multiple electronic components flip-chip bonded to a top surface of a memory module according to embodiments of the present technology.

The particular configuration of electronic component 500 shown in FIG. 31 is by way of example, and the electronic component 500 may have other shapes in further embodiments. In one such further embodiment, the electronic component 500 may have the same footprint as (or even larger than) the footprint of memory module 150. Additionally, as shown in FIG. 32, it is contemplated that two or more electronic components 500, 510 may be mounted to the bond pads 142 on an upper surface of a memory module.

Figure 33:
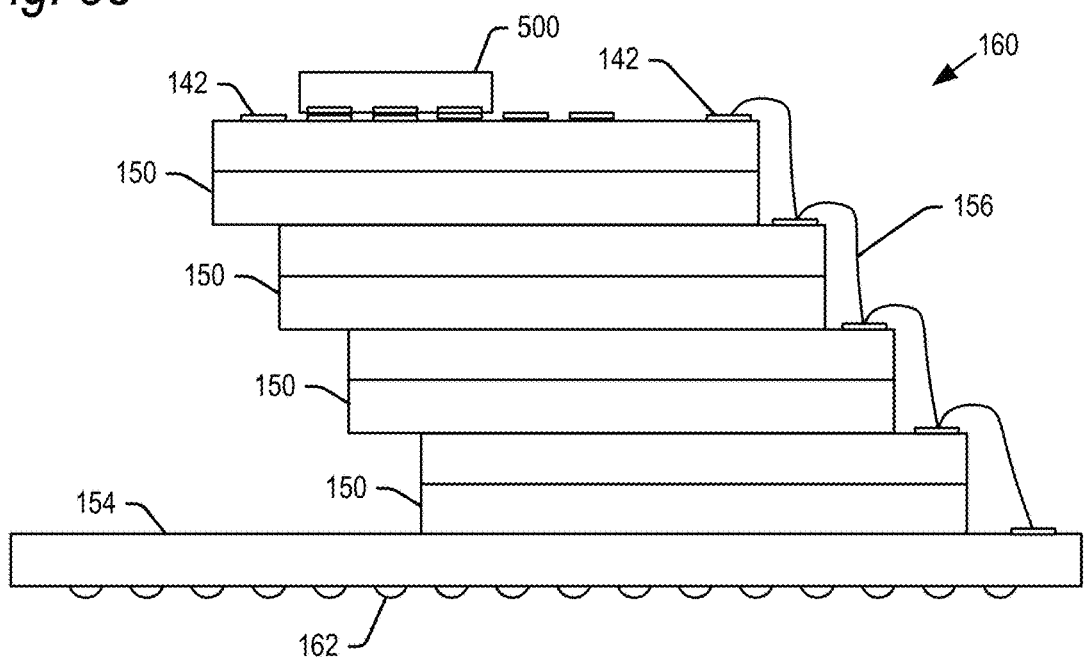
FIGS. 33 and 34 are cross-sectional edge views showing stacked memory modules including an electronic component on a top surface according to embodiments of the present technology.
Figure 34:
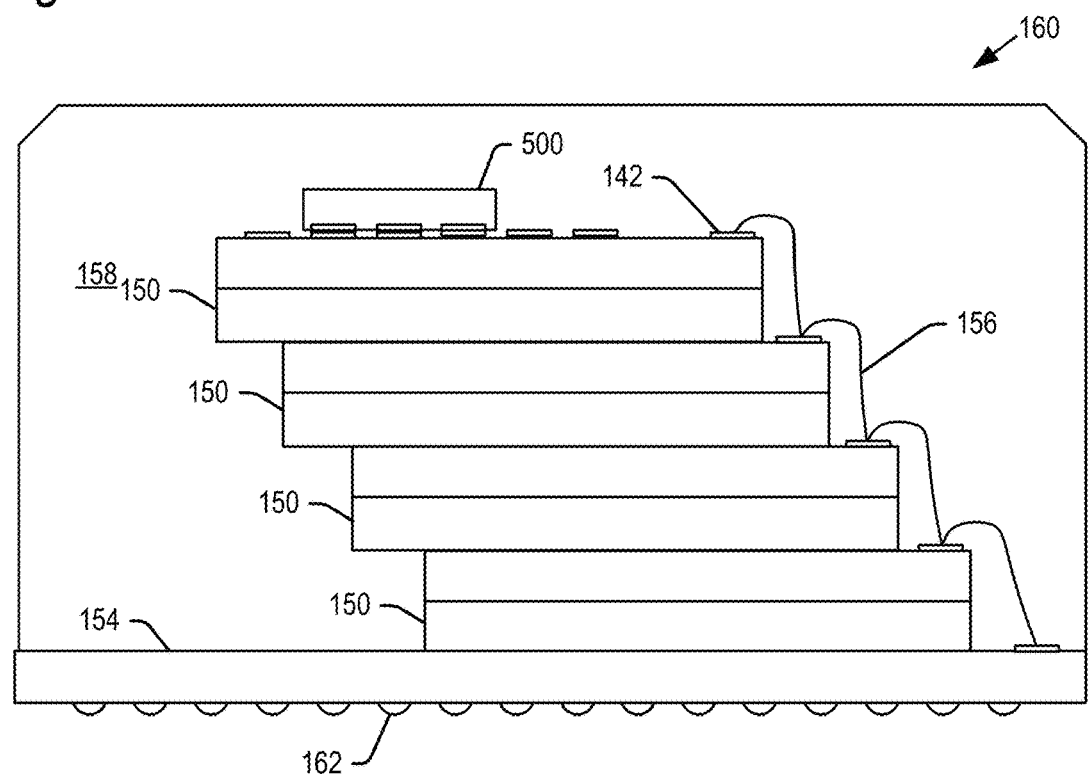

As noted, the electronic component 500 may be mounted on an individual memory module or, alternatively, a stack of memory modules. FIG. 33 illustrates a stack of memory modules 150 mounted on a substrate 154 and wire bonded to each other with wire bonds 156 as described above respect to FIG. 16. Once the wire bonds are formed, the memory modules 150 may be encapsulated in a mold compound 158 to form a finished semiconductor device 560 as shown in FIG. 34. Solder balls 162 may optionally be affixed to contact pads on a lower surface of substrate 154 of the semiconductor device 560. The solder balls 162 may be used to electrically and mechanically couple the semiconductor device 560 to a host device (not shown) such as a printed circuit board. Solder balls 162 may be omitted where the semiconductor device 160 is to be used as an LGA package.

The embodiments of the present technology shown in FIGS. 29-34 allow direct electrical connection between electronic component 500 and memory modules 150, 350, 450, thus improving the speed performance of the combination due to lower electrical parasitics. Additionally, mounting the electronic component on top of the memory module (within the footprint of the memory module) reduces the area otherwise occupied by both the memory modules and electronic component on a PCB or other host device. Further still, the embodiments shown for example in FIGS. 31 and 32 may be incorporated into a chip scale package and may allow omission of a substrate altogether.

In summary, embodiments of the present technology relate to a memory module, and semiconductor device made therefrom, where the memory module may be formed from a pair of semiconductor dies mounted face to face to each other at the wafer level. These die pairs are formed using wafer-to-wafer bonding technology, where the wafers may be bonded to each other when they are of full thickness. Once bonded, respective inactive surfaces of the wafers may be thinned and then the die pairs diced from the wafers to form a completed memory module.

The completed memory module may have a total thickness of 36-38 µm (similar to the current thickness of the current generation dies). Effectively, each die in the memory module is about 18-19 µm thick. As the pair of dies are bonded at wafer level when the wafers are of full thickness, there is no processing of 18 µm thick dies. This is a significant advantage in that it avoids the mechanical issues of warping, cracking and chipping of thinner dies. The overall thickness of the memory module may be further reduced to 25 µm or below, allowing for a single die effective thickness of 12.5 µm allowing for even higher density.

When the wafers are bonded face to face, they compensate each other mechanically resulting in the die pair having a minimum warpage (about 30 µm or lower). This is a significant improvement from 450 µm die warpage of current 3D NAND dies, and as noted, is an important factor which will allow further reduction in the thicknesses of memory modules fabricated according to the present technology.

Memory modules of the present technology provide the memory size of two conventional dies in the same die thickness, thereby effectively doubling the memory density in the same form factor as current dies. Currently, BiCS4 generation has 96 memory layers. With the die pair of the present technology, it provides 192 layers of memory, again, in the same form factor as current dies.

The memory module of the present technology is a single physical unit, but two separately accessible electrical units. This ability to independently access the two dies in a memory module provides significant advantages, including for example the ability to manage yield losses related to wafer-to-wafer integration of two wafers with different yield maps. In the architecture, I/O connections of the two dies are brought to the surface separately to allow independent connections to the dies. This allows the ability to utilize all the good dies, even where one of the dies in a memory module fails. With binning, it can be ensured that no good die is wasted. In addition, option always exists to serially connect the two dies as well, if the memory design allows to decouple the bad dies from the stack. This is especially useful as the number of dies in a stack increases.

From a die edge chipping issue, the memory modules of the present technology are handled in a wafer form until they are thinned to 36 µm and diced. At this thickness, it has been demonstrated that there are minimum issues related to die edge chipping or cracking.

One example of the present technology relates to an integrated memory module comprising: a first semiconductor die, comprising: a first memory array, a first substrate, and a first surface having a first group of bond pads; a second semiconductor die, comprising: a second memory array, a second substrate adjacent the second memory array, a second surface having a second group of bond pads, and a third surface, opposite the second surface, having a third group of bond pads, wherein the first and second surfaces are bonded together to join the first and second semiconductor dies to each other; and a logic circuit in the first semiconductor die for controlling and driving memory elements of the first and second memory arrays to accomplish programming and read/write operations in the first and second memory arrays.

In another example, the present technology relates to an integrated memory module comprising: a logic circuit for controlling and driving memory elements of the first and second memory arrays to accomplish programming and read/write operations in the first and second memory array; a first semiconductor die, comprising: a first memory array, a first substrate, and a first surface having a first group of bond pads; and a second semiconductor die, comprising: a second memory array, a second substrate adjacent the second memory array, a second surface having a second group of bond pads, and a third surface, opposite the second surface, having a third group of bond pads, wherein the first and second surfaces are bonded together to join the first and second semiconductor dies to each other.

In a further example, the present technology relates to an integrated memory module comprising: a first semiconductor die, comprising: a first memory array, a first substrate, and a first surface having a first group of bond pads; a second semiconductor die, comprising: a second memory array, a second substrate adjacent the second memory array, a second surface having a second group of bond pads, and a third surface, opposite the second surface, having a third group of bond pads, wherein the first and second surfaces are bonded together to join the first and second semiconductor dies to each other; and logic circuit means for controlling and driving memory elements of the first and second memory arrays to accomplish programming and read/write operations in the first and second memory arrays.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modi-

What is claimed is:

1. An integrated memory module comprising:
   a first semiconductor die, comprising:
      a first memory array,
      a first substrate, and
      a first surface having a first group of bond pads;
   a second semiconductor die, comprising:
      a second memory array,
      a second substrate adjacent the second memory array,
      a second surface having a second group of bond pads, and
      a third surface, opposite the second surface, having a third group of bond pads, wherein the first and second surfaces are bonded together to join the first and second semiconductor dies to each other; and
   a logic circuit in the first semiconductor die for controlling and driving memory elements of the first and second memory arrays to accomplish programming and read/write operations in the first and second memory arrays.

2. The integrated memory module of claim 1, wherein the logic circuit is a CMOS logic circuit.

3. The integrated memory module of claim 1, wherein the logic circuit and first memory array are next to each other on the first substrate.

4. The integrated memory module of claim 1, wherein the logic circuit is located beneath the first memory array, between the first substrate and the first memory array.

5. The integrated memory module of claim 1, further comprising a first set of vias in the first semiconductor die electrically coupling the logic circuit with the first group of bond pads on the first surface.

6. The integrated memory module of claim 5, further comprising a second set of vias extending between the second and third groups of bond pads in the second semiconductor die, the second set of vias electrically coupling the logic circuit with the third group of bond pads on the third surface.

7. The integrated memory module of claim 6, wherein the second set of vias are located next to the second memory array.

8. The integrated memory module of claim 1, wherein the first and second groups of bond pads comprise bond pads having length and width dimensions between 1 micron and 5 microns.

9. The integrated memory module of claim 1, wherein the third group of bond pads are configured to receive wire bonds for electrically coupling the integrated memory module to a host device.

10. The integrated memory module of claim 1, wherein the logic circuit communicates with the host device though an electrical path comprising a first set of vias in the first semiconductor die, the first group of bond pads coupled to the first set of vias, the second group of bond pads coupled to the first group of bond pads, a second set of vias in the second semiconductor die coupled to the second group of bond pads, the third group of bond pads coupled to the second set of vias and the wire bonds.

11. An integrated memory module comprising:
   a logic circuit for controlling and driving memory elements of the first and second memory arrays to accomplish programming and read/write operations in the first and second memory array;
   a first semiconductor die, comprising:
      a first memory array,
      a first substrate, and
      a first surface having a first group of bond pads; and
   a second semiconductor die, comprising:
      a second memory array,
      a second substrate adjacent the second memory array,
      a second surface having a second group of bond pads, and
      a third surface, opposite the second surface, having a third group of bond pads, wherein the first and second surfaces are bonded together to join the first and second semiconductor dies to each other.

12. The integrated memory module of claim 11, wherein the logic circuit is part of the second semiconductor die.

13. The integrated memory module of claim 12, wherein the logic circuit is located beneath the first memory array, between the first substrate and the first memory array.

14. The integrated memory module of claim 12, wherein the logic circuit and the first memory array are located next to each other on the first substrate.

15. The integrated memory module of claim 11, further comprising a third semiconductor die affixed to one of the first and second semiconductor dies, the third semiconductor die comprising the logic circuit.

16. The integrated memory module of claim 11, the first semiconductor die further comprising a fourth surface opposite the first surface, the fourth surface comprising a fourth group of bond pads, the integrated memory module further comprising a third semiconductor die, affixed to the fourth surface and fourth group of bond pads, the third semiconductor die comprising the logic circuit.

17. The integrated memory module of claim 16, wherein the first, second and third semiconductor dies are affixed to each other by one of Cu to Cu bonding, oxide to oxide bonding or hybrid bonding techniques.

18. The integrated memory module of claim 11, further comprising sets of vias in the first and second semiconductor dies for electrically coupling the logic circuit with the third group of bond pads.

19. The integrated memory module of claim 18, wherein third group of bond pads are configured to receive wire bonds for electrically coupling the integrated memory module to a host device.

20. An integrated memory module comprising:
   a first semiconductor die, comprising:
      a first memory array,
      a first substrate, and
      a first surface having a first group of bond pads;
   a second semiconductor die, comprising:
      a second memory array,
      a second substrate adjacent the second memory array,
      a second surface having a second group of bond pads, and
      a third surface, opposite the second surface, having a third group of bond pads, wherein the first and second surfaces are bonded together to join the first and second semiconductor dies to each other; and
   logic circuit means for controlling and driving memory elements of the first and second memory arrays to accomplish programming and read/write operations in the first and second memory arrays.

* * * * *